United States Patent
Nishino et al.

(10) Patent No.: US 7,570,135 B2
(45) Date of Patent: Aug. 4, 2009

(54) PIEZOELECTRIC VIBRATOR AND METHOD FOR PRODUCING THE SAME, AN OSCILLATOR, AN ELECTRONIC UNIT AND A WAVE TIMEPIECE

(75) Inventors: Yoshifumi Nishino, Chiba (JP); Hiroaki Uetake, Chiba (JP); Yuki Hoshi, Chiba (JP)

(73) Assignee: Seiko Instruments Inc. (JP)

( * ) Notice: Subject to any disclaimer, the term of this patent is extended or adjusted under 35 U.S.C. 154(b) by 379 days.

(21) Appl. No.: 11/342,212

(22) Filed: Jan. 27, 2006

(65) Prior Publication Data

US 2006/0176127 A1 Aug. 10, 2006

(30) Foreign Application Priority Data

Feb. 7, 2005 (JP) ............................. 2005-031084

(51) Int. Cl.
*H03H 9/17* (2006.01)
*H01L 41/22* (2006.01)
(52) U.S. Cl. ..................... 333/187; 29/25.35; 29/827; 29/841
(58) Field of Classification Search ................. 333/187; 310/348; 29/25.35
See application file for complete search history.

(56) References Cited

U.S. PATENT DOCUMENTS 4,035,673 A * 7/1977 Ishida et al. ................. 310/344
5,592,130 A * 1/1997 Ikeda et al. .................. 331/158
6,577,559 B1 * 6/2003 Fleury et al. ................. 368/250
6,808,950 B2 * 10/2004 Komoto et al. ................ 438/29
7,345,411 B2 * 3/2008 Sato et al. .................... 310/365

OTHER PUBLICATIONS

Patent Abstracts of Japan, publication No. 08-316761, publication date Nov. 29, 1996.
Patent Abstracts of Japan, publication No. 11-298279, publication date Oct. 29, 1999.

* cited by examiner

*Primary Examiner*—Benny Lee
*Assistant Examiner*—Alan Wong
(74) *Attorney, Agent, or Firm*—Adams & Wilks

(57) ABSTRACT

A method is provided for producing a piezoelectric vibrator having an airtight terminal comprised of an annular stem, a lead disposed to pass through the stem and formed of a conductive material, and a filler for fixing the lead in the stem, and the piezoelectric vibrator having a vibrating piece connected to the lead of the airtight terminal and a case bonded to the airtight terminal to cover the vibrating piece. The method comprises an airtight terminal production process that produces the airtight terminal on a lead frame, and a piezoelectric vibrator assembly process that assembles the piezoelectric vibrator using the produced airtight terminal and on the same lead frame on which the airtight terminal is produced.

19 Claims, 24 Drawing Sheets

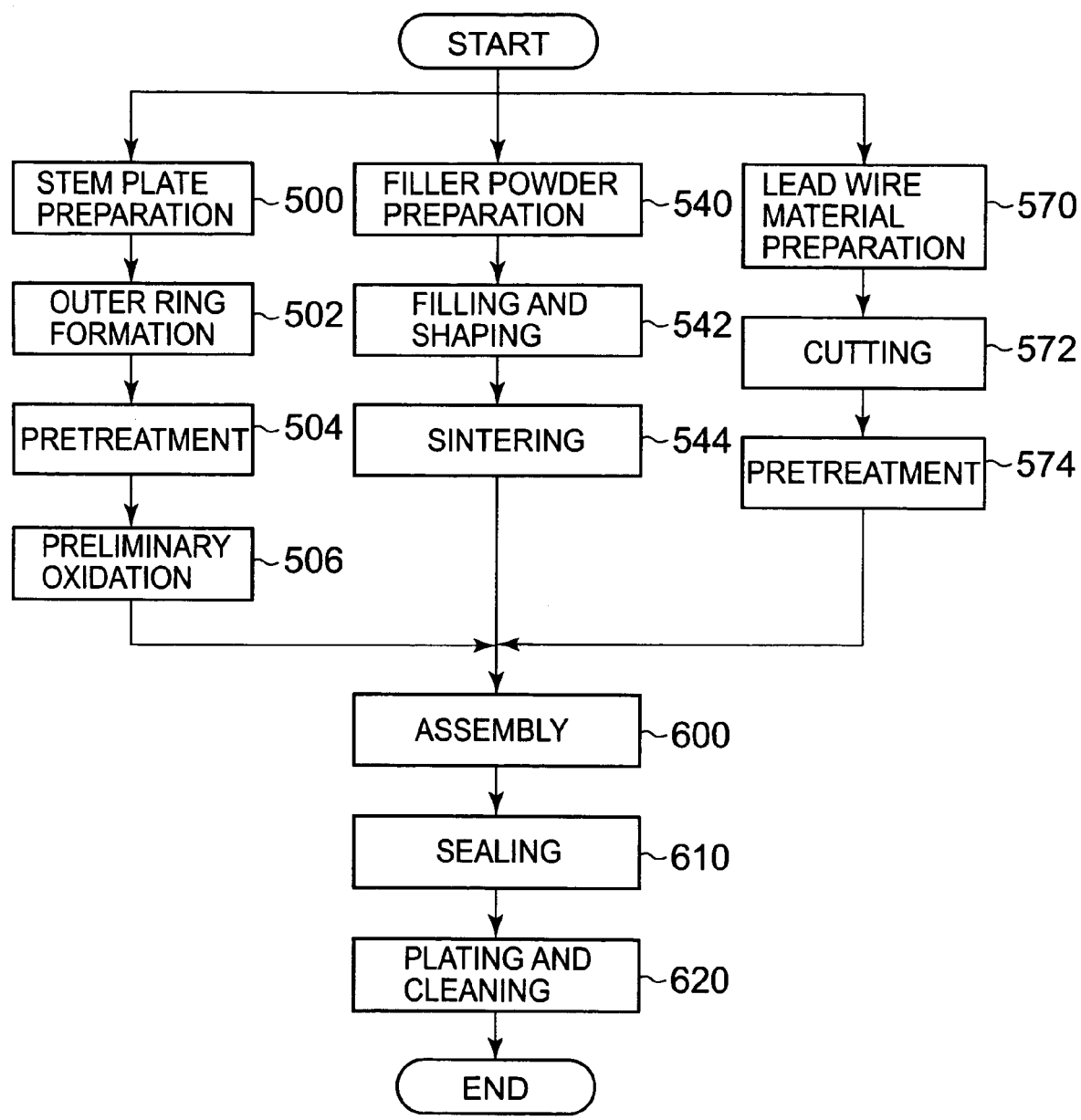

PIEZOELECTRIC VIBRATOR AND METHOD FOR PRODUCING THE SAME, AN OSCILLATOR, AN ELECTRONIC UNIT AND A WAVE TIMEPIECE

BACKGROUND OF THE INVENTION

1. Field of the Invention

The present invention relates to a piezoelectric vibrator having an airtight terminal and a method for producing the piezoelectric vibrator, as well as an oscillator, an electronic unit and a wave timepiece having a piezoelectric vibrator.

2. Description of the Related Art

Piezoelectric vibrators are indispensable to the production of industrial products such as watches including wave watches/clocks, oscillators, portable units, and electronic units. Piezoelectric vibrators are used in timekeeping sources, timing sources or reference sources for signals. Piezoelectric vibrator packages commonly used include box-shaped ceramic packages and cylinder-type packages provided with leads. In the latter packages, shaped parts are produced, where leads are mounted directly on substrates by means of soldering, packages are molded of resin and electrode terminals using lead frames are provided so that the packages are suitable for machine mounting using automatic mounting machines.

A cylinder type package and a resin molded package will be described below with reference to the drawings. FIG. 19A is a perspective view showing the entire construction of an example of a quartz crystal vibrator for a related-art cylinder type package as a piezoelectric vibrator. FIG. 19B is a cross-sectional view of an airtight terminal portion of the example shown in FIG. 19A.

A vibrating piece 8 composed of a quartz crystal formed tuning fork type is secured to the inner lead 3 of an airtight terminal 1 by means of plating using a metal film and a conductive adhesive, which are not shown. The vibrating piece 8 is also airtight sealed by means of a bottomed cylindrical metallic case 10 close fit thereto to provide a vacuum. Note that in FIG. 19A the case 10 is shown to be a transparent body for the description of the internal construction thereof. As shown in g. FIG. 19B, the airtight terminal 1 is filled with a filler 5, which is used for hermetic sealing in an outer ring called a stem 7. Two parallel leads 2 each composed of a thin solid metal round bar are inserted through and fixed to the filler 5. The surfaces of the lead 2 and the stem 7 are coated with a plating 16a. The inner lead 3 and the vibrating piece 8 shown in FIG. 19A are connected to each other through the plating 16a by locally melting the plating 16a of the surface of the inner lead 3 and securing the lead 3 to a mount pad 9 as a connection region, which is formed at the base of the vibrating piece 8. An excitation electrode, not shown, is formed on the tuning fork arm portion of the vibrating piece 8 and an alternating current is fed to the excitation electrode from the lead 2 of the airtight terminal 1 through the mount pad 9. This causes the vibrating piece 8 to vibrate at a predetermined frequency.

The case 10 is also press fit to the stem 7 so as to cover the vibrating piece 8 along the outside perimeter of the stem 7. This step is called a capping step or sealing step. The case 10 is airtight bonded to the stem 7 by means of cold pressure welding through the plating 16a, a soft metal which the outer ring of the stem 7 is made of. In FIG. 19B, with the filler 5 as a border, the thickness of the plating 16a is exaggerated. Note that in the lead 2, the side which is bonded to the vibrating piece 8 is herein referred to as an inner lead, depicted by a reference numeral 3, while the side which is mounted on a substrate and the like is referred to as an outer lead 4, depicted by a reference numeral 4.

FIG. 20A is a plan view of a resin molded package for a piezoelectric vibrator of a related art. FIG. 20B is a front view of the package shown FIG. 20A. FIG. 20C is a bottom view of the package shown FIG. 20A. FIG. 20D is a cross sectional view of the package shown FIG. 20A, taken along a line D-D. FIG. 20E is a right-hand side view of the package shown in FIG. 20B.

The resin molded package has a construction of a cylinder type package with piezoelectric vibrators 40, which is molded of resin such as epoxy resin, which is a thermosetting resin, and a liquid-crystal polymer, which has thermal plasticity. The use of these resins 30 are determined considering reliability requirements such as the absence of voids, cracks, and peelings at molding, the absence of deformation and cracks in mounting on a substrate in reflow, moisture resistance at high temperatures. Efforts are so made to prevent the outside dimensions of the resin molded package from exceeding the outside dimensions of a ceramic package. In other words, an external electrode terminal 34 is mechanically and electrically connected to the outer lead 4 of the airtight terminal and the welding region 33 by means of spot welding and the like in a space in the resin molded package. The external electrode terminal 34 is also exposed at the bottom via a crank-shaped bent portion 34a. In addition, dummy terminal 35 each having a rise portion 35a are disposed in a resin 30 at intervals at an end opposite to the external electrode terminal 34 of the resin molded package. Therefore, each of the dummy terminals 35 is rigidly mounted on a substrate. The dummy terminal 35 is not electrically connected to the vibrating piece 8 inside the piezoelectric vibrator 40, thus allowing the width of the resin molded package to sufficiently smaller than a ceramic package. Packages molded of resin are in heave usage in portable units, for which high-density mounting is required.

A process for manufacturing a resin molded package will be briefly described below in terms of problems in the order of an airtight terminal production process, a cylinder type package piezoelectric vibrator assembly process, and a resin molded package production process. The present invention is intended to provide a production method where airtight terminals can be caused to flow in a single support material consistently, without replacing the support material for holding airtight terminals in each of these three steps, from the start of the airtight terminal production process to the end of the resin molded package production process. However, a piezoelectric vibrating piece production process will be described later.

[Airtight Terminal Production Process]

A related-art airtight terminal production process will be described below with reference to a production flow chart shown in FIG. 21.

Parts composed of an airtight terminal are one annular stem, two wire-like leads, and one granular filler. Each of these parts is produced in a step thereof before these parts are assembled together. For the annular stem and the lead, a material such as low carbon steel (Fe), alloy of ion and nickel (Fe—Ni), an alloy of ion, nickel, and cobalt (Fe—Ni—Co) is used. For the material of the filler, Soda lime glass and soda barium glass, borosilicate glass and the like are selected.

For the stem, a plate material of any of the materials described above is prepared (step 500) and an outer ring is shaped through a press work (step 502). Pretreatment is then performed using an acid (step 504). Annealing is then performed and preliminary oxidation is performed for improvements in adhesiveness to the filler (step 506). For the filler, borosilicate glass powder is prepared, for example (step 540). The powder is then charged into a mold for shaping and mechanical properties are conditioned (step 542). Sintering is then performed at a high temperature (step 544).

For the lead, a wire rod made of any of the materials described above is prepared (step 570) and cut to pieces of a predetermined length (step 572). Pretreatment is then performing using an acid (step 574). Annealing is then performed and preliminary oxidation is performed for improvements in adhesiveness to the filler (step 576).

A plurality of stems thus prepared, a plurality of fillers thus prepared, and a plurality of leads thus prepared are set in a carbon assembly jig (step 600). Firing is then performed in an electric furnace or the like at a temperature of approximately 1000° C. to rigidly seal the filler to the stem and the lead for an airtight construction (step 610). On completion of the sealing step by firing described above, in the airtight terminal, the metal stem has been filled with the filler, which is used for hermetic sealing, and two parallel leads has been inserted through and fixed to the filler, thus completing a contour thereof.

Airtight terminals are then removed from the carbon assembly jig and each separate airtight terminal is placed in a predetermined net for barrel plating. A plating film is then formed on the outer peripheral surface of the stem and the surface of the lead while a plurality of airtight terminals are agitated in a barrel. Before the plating operation described above, the surface of the filler, the surface of the stem and the surface of the lead are etched and cleaned using an acid. A few μm of base coat plating of an element such as Ni and Cu is applied to each of these surfaces. A finish coat plating with a thickness of 10 to 15 μm is then applied to each of the above surfaces (step 620).

The airtight terminals are completed through the steps described above. A case, which is paired with the airtight terminal, is formed of a nickel silver sheet through a press work for later use. The surface of the case is coated with a Ni plating.

[Piezoelectric Vibrator Assembly Process]

A vibrator assembly process where cylinder type package piezoelectric vibrators are produced using the airtight terminals and cases described above will be described below with reference to a production flow chart shown in FIG. 22. An automated assembly process for such a cylinder type package piezoelectric vibrator is conventionally known.

A plurality of airtight terminals are arranged and mechanically held at constant intervals on each horseshoe-shaped resin molded jig called a pallet and caused to flow through the assembly step described below.

Before arrangement on a pallet, airtight terminals stored after production are first heated sufficiently in a vacuum and baking is perform to remove and release moisture absorbed and gas components contained from member materials (step 700). The plurality of airtight terminals are then mounted and arranged at constant intervals on the pallet using a jig (step 710). FIG. 24 is a pattern diagram showing a state where airtight terminals are arranged on a pallet. In FIG. 24, outer leads 4 of airtight terminals are mechanically held in metal terminals 39 mounted on a pallet 38 and positioned. The metal terminal 39 is a metal fixing fitting.

Referring back to FIG. 22, a vibrating piece 8 is mounted on (connected to) the inner lead 3 of an airtight terminal 1 (step 720). Baking is then performed in a vacuum to alleviate mount distortion (step 730). Then pallet 38 with the airtight terminals thereon is then charged into a vacuum chamber and frequency trimming (fine trimming) is made using a laser or the like while monitoring the frequency for a frequency in a predetermined frequency range (step 740).

Each case 10 is then disposed in positions opposite to each of the airtight terminals arranged on the pallet 38 and each airtight terminal 1 is press fit to and airtight sealed to each case 10 in a vacuum atmosphere (step 750). In the sealing step, each of the airtight terminals is kept sufficiently hot to release moisture absorbed and gas components contained during the assembly step therefrom before capping in each case 10. Capping the airtight terminal in the case provides the contour of a cylinder type package piezoelectric vibrator 40.

After airtight sealing, screening is performed for frequency stabilization at a predetermined temperature in the atmosphere (step 760). An electrical property inspection is then performed in terms of resonance frequency and resonant resistance values and the like. This step is called a sorting step (step 770). The vibrators thus obtained are removed from a pallet 38 using a dedicated jig (step 780).

The step described above provides complete piezoelectric vibrators 40 each having the contour of a cylinder type package. Mass production of piezoelectric vibrators requires a large number of pallets 38 described above, thus requiring large amounts of money for pallet purchase, maintenance, and disposal including metal-holding fixture replacement.

[Resin Shaping Process]

A production process for molding cylinder the type package piezoelectric vibrator 40 of resin, which is produced through the piezoelectric vibrator assembly process described above will be described below with reference to FIGS. 23 and 25. FIG. 23 is a flow chart showing a related-art resin shaping process for molding a cylinder type package piezoelectric vibrator of resin. FIGS. 25A and 25B are pattern diagrams showing piezoelectric vibrators fixed to a related-art lead frame used in the resin shaping process. FIG. 25A is a plan view of a plurality of piezoelectric vibrators fixed to a related-art lead frame. FIG. 25B is a fragmentary enlarged view of one the plurality of piezoelectric vibrators shown in FIG. 25A. A resin shaping process for such a cylinder type package piezoelectric vibrator 40 is known.

According to a related-art production process, a conductive material is selected for a special lead frame 31 and a lead frame 31 is obtained through blanking as shown in FIG. 25A. As shown in FIG. 25B, a bending work is performed on the lead frame 31 to form an external electrode terminal 34 having a bent portion 34a and a dummy terminal 35 having a rise portion 35a is disposed in an opposite position (step 800). Cylinder type package piezoelectric vibrators 40 are fed to and positioned on the lead frame 31 thus prepared (step 810).

Outer leads 4 of the airtight terminals are then shaped and a portion of an extra length is cut off from each of the outer leads (step 820). The external electrode terminal 14 formed in the lead frame 31 and the outer lead 4 of the airtight terminal are then inserted between a top die and bottom die, welding such as resistance welding is performed to connect the external electrode terminal and the outer lead to each other, and an inspection is performed to check if the external electrode terminal and the outer lead are connected to each other (step 830). A spot welding region is depicted by a reference numeral 33. The plurality of piezoelectric vibrators 40 are welded to the lead frame 31 and arranged in two rows.

A resin material is shaped by means of a transfer mold and the contour of a piezoelectric vibrator shaped is formed (step 840). In FIG. 25B, the mold section 32 for resin shaping is indicated by dashed lines. A marking is performed on the surface of a resin shaped 30 by means of printing, a laser and the like (step 850). Any thin burr from molding is then removed from the resin 30 (step 860). The lead frame 31 is charged into a plating bath to coat the external electrode terminal 34 and the dummy terminal 35 with a plating film not shown with a thickness approximately 5 to 15 μm (step 870). In some cases, a plating film is formed on the lead frame 31 in advance. In these cases, the plating step described above will be omitted.

The lead frame 31 is then cut where the external electrode terminal 34 is located and where the dummy terminal 35 is located to obtain individual separate piezoelectric vibrators resin molded (step 880). A sorting is then performed in terms of resonance frequency and resonant resistance values and the like for vibrators (step 890).

The steps described above provide complete resin molded cylinder type package piezoelectric vibrators. The appearance of a completed piezoelectric vibrator described above is shown in FIGS. 20A to 20D, which have been already described above. Therefore, the appearance of the completed piezoelectric vibrator will not be described below.

Problems relating to flow in the three steps described above can be summarized as shown below.

1) In the airtight terminal production process, three parts, that is, the lead, the filler, and the stem, are fired into a one-piece component and individual separate airtight terminals are placed in a predetermined net for plating operations. Conventionally, barrel plating is employed considering mass productivity because a large number of airtight terminals are handled in a single plating secession. However, a plaint operation for small airtight terminals corresponding to small piezoelectric vibrators suffers from a great drop in yield due to short circuits between airtight terminal leads connected together through plating. The smaller airtight terminals are, the conspicuous the above-mentioned drop in yield is, thus raising a big problem that leads to an increase in airtight terminal unit price.

2) In the piezoelectric vibrator assembly process, resin molded pallets are introduced as jigs for assembly flow. Individual separate airtight terminals are fed to after the end of the airtight terminal production process and the arrangement and mounting of these airtight terminals on pallets requires much time and money, thus resulting in a long operation time with a long a lead time.

With a reduction in the size airtight terminals, more lead bends and leads connected together are found in units for parts supply that uses vibrations, such parts feeders, thus resulting in a low level of contour accuracy for the airtight terminals. Contact between airtight terminals causes fine metal particles and these particles on leads and stems as well as vibrating pieces handled during the assembly step result in different vibrating piece weights and therefore a fluctuation in oscillation frequency.

During heating in a vacuum, pallets made of resin also emit gases in the assembly step and the capping step, resulting in a drop in degree of vacuum. Therefore, there is a problem that these gases causes change in resonance frequency and resonant resistance values over time for vibrators after airtight sealing. As described, there is also changing performance, which is a big problem in the aspect of quality.

3) In the resin shaping process, new special dedicated conductive lead frames need to be prepared. It is necessary to feed cylinder type package piezoelectric vibrators to these lead frames, align each of these piezoelectric vibrators with each lead frame with good accuracy, and connect the piezoelectric vibrators and the frames together by means of welding and the like. There is a tendency that there are more failures in vibrator feeding and more welding failures with a reduction in the size of vibrators, thus leading to more inspection in processes and therefore increased production costs.

In addition, providing the external electrode terminal and the dummy terminal necessitates a second plating of terminals, thus leading to a great cause of increased lead time in production.

Solutions to a large number of the foregiong problems in conventional piezoelectric vibrator production methods are essential to improvements in assembly accuracy, quality, and reduction in production costs through a reduced lead time in production to accommodate demands in rapid product size reduction.

SUMMARY OF THE INVENTION

Considering the problems described above, the present invention provides a piezoelectric vibrator production method that can address a reduction in size of piezoelectric vibrators and allows improvement in assembly accuracy and quality.

To solve the problems described above, the present invention provides a production method where airtight terminals can be caused to flow in a single support material consistently from the start of the airtight terminal production process to the end of the resin shaping process, without replacing the support material for holding airtight terminals in each of these three steps, i.e., the airtight terminal production process, the piezoelectric vibrator assembly process, and the resin shaping process.

1) For the airtight terminal production process and the piezoelectric vibrator assembly process, the present invention provided a method described below.

The present invention provides a method of producing a piezoelectric vibrator having an airtight terminal composed of an annular stem, a lead disposed to pass through the stem and formed of a conductive material, and a filler for fixing the lead in the stem, a vibrating piece connected to the lead, and a case bonded to the airtight terminal to cover the vibrating piece, the method comprising an airtight terminal production process for producing the airtight terminal, and a piezoelectric vibrator assembly process for assembling the piezoelectric vibrator using the airtight terminal, wherein in the airtight terminal production process and the piezoelectric vibrator assembly process, the airtight terminal is arranged and held on a same lead frame and is caused to flow consistently.

2) For the resin shaping process, the present invention also provides a method where airtight terminals can be caused to flow consistently without replacing the support material for holding airtight terminals, besides the above two steps described above.

That is to say, the present invention provides a method of producing a piezoelectric vibrator having an airtight terminal composed of an annular stem, a lead disposed to pass through the stem and formed of a conductive material, and a filler for fixing the lead in the stem, a vibrating piece connected to one end of the lead, a case bonded to the airtight terminal to cover the vibrating piece and a mold resin for covering a surface of the case and a surface of the airtight terminal so that the other end of the lead is exposed, the method comprising an airtight terminal production process for producing the airtight terminal, a piezoelectric vibrator assembly process for assembling the piezoelectric vibrator using the airtight terminal, and a resin shaping process for shaping the mold resin, wherein in the airtight terminal production process, the piezoelectric vibrator assembly process and the resin shaping process, the airtight terminal is arranged and held on a same lead frame and is caused to flow consistently.

3) The present invention provides an airtight terminal production process described below as a concrete method that allows the same lead frame to be used for flowing purposes in airtight terminal production process and the piezoelectric vibrator assembly process.

That is to say, the airtight terminal production process comprises a contour formation step of selecting a plate- or strip-shaped conductive material for the lead frame, disposing a contour formation portion for forming a contour of a lead for the airtight terminal and a base on the lead frame, forming a plurality of contours of the lead of the airtight terminal with one end thereof connected to the base by a connection at predetermined intervals, and forming a plurality of contours of an insulated connection with the one end thereof connected to the base on the contour formation portion with the insulated connection facing the lead so that each of the plurality of contours of the insulated connection is paired with each of the plurality of contours of the lead, a filler shaping and sintering step of filling the lead having the contours thereof formed with the filler in a predetermined position and shaping the filler, filling the lead with the filler and shaping the fill to connect the one end of the lead to a non-base side of the insulated connection having the contours thereof formed, and sintering the two fillers shaped, a stem mounting step of mounting a stem on a circumference of the fillers sintered, the filler sintered being located on the lead, a firing step of heating, melting and cooling the filler in the stem and the filler at the insulated connection, a partial cutting step of cutting off a portion connected to the base of the lead, and a metal film formation step of forming a metal film on a surface of the lead and a surface of the stem.

4) For the resin shaping process, the contour formation step in the airtight terminal production process is considered and also provides a method described below as a concrete method that allows the same lead frame to be used for flowing purposes, besides the airtight terminal production process and the piezoelectric vibrator assembly process.

That is to say, the present invention provides a piezoelectric vibrator production method wherein the contour formation step includes arranging a plurality of contours of the lead on the contour formation portion at predetermined intervals, forming a contour of an external electrode terminal so that the contour branches off from each of the plurality of contours of the lead, is disposed to be parallel to the lead, and extend and is connected to the base, forming a contour of the insulated connection with one end thereof connected to the base so that the contour of the insulated connection faces each of the plurality of contours of the lead, and forming a dummy terminal connected to the base on the contour formation portion so that the dummy terminal faces the external electrode terminal.

5) In addition, the piezoelectric vibrator assembly process comprises bending the a portion of the lead connected the insulated connection of the lead frame at a predetermined angle before capping a case and correcting the bent portion of the lead so that the portion is at an original angle thereof.

6) In addition, piezoelectric vibrators are produced by the piezoelectric vibrator production method described above.

7) The present invention also provides a piezoelectric vibrator comprising an airtight terminal composed of an annular stem, a lead disposed to pass through the stem and formed of a conductive material, and a filler for fixing the lead in the stem, a vibrating piece connected to the lead, a case bonded to the airtight terminal to cover the vibrating piece, and wherein in the airtight terminal production process for producing the airtight terminal and the piezoelectric vibrator assembly process for assembling the piezoelectric vibrator using the airtight terminal, a same lead frame is used and the airtight terminal is arranged and held on the lead frame and is caused to flow consistently.

8) The present invention also provides a piezoelectric vibrator comprising, an airtight terminal composed of an annular stem, a lead disposed to pass through the stem and formed of a conductive material, and a filler for fixing the lead in the stem, a vibrating piece connected to one end of the lead, a case bonded to the airtight terminal to cover the vibrating piece, and a mold resin for covering a surface of the case and a surface of the airtight terminal so that the other end of the lead is exposed, wherein in the airtight terminal production process for producing the airtight terminal, the piezoelectric vibrator assembly process for assembling the piezoelectric vibrator using the airtight terminal, and the resin shaping process for shaping the mold resin, a same lead frame is used and the airtight terminal is arranged and held on the same lead frame and is caused to flow consistently.

9) The airtight terminal is produced by performing a contour formation step of selecting a plate- or strip-shaped conductive material for the lead frame, disposing a contour formation portion for forming a contour of a lead for the airtight terminal and a base on the lead frame, forming a plurality of contours of the lead of the airtight terminal with one end thereof connected to the base by a connection at predetermined intervals, and forming a plurality of contours of an insulated connection with the one end thereof connected to the base on the contour formation portion with the insulated connection facing the lead so that each of the plurality of contours of the insulated connection is paired with each of the plurality of contours of the lead, a filler shaping and sintering step of filling the lead having the contours thereof formed with the filler in a predetermined position and shaping the filler, filling the lead with the filler and shaping the fill to connect the one end of the lead to a non-base side of the insulated connection having the contours thereof formed, and sintering the two fillers shaped, a stem mounting step of mounting a stem on a circumference of the fillers sintered, the filler sintered being located on the lead, a firing step of heating, melting and cooling the filler in the stem and the filler at the insulated connection, a partial cutting step of cutting off a portion connected to the base of the lead, and a metal film formation step of forming a metal film on a surface of the lead and a surface of the stem.

10) In the contour formation step, the piezoelectric vibrator is produced by arranging a plurality of contours of the lead on the contour formation portion at predetermined intervals, forming a contour of an external electrode terminal so that the contour branches off from each of the plurality of contours of the lead, is disposed to be parallel to the lead, and extend and is connected to the base, forming a contour of the insulated connection with one end thereof connected to the base so that the contour of the insulated connection faces each of the plurality of contours of the lead, and forming a dummy terminal connected to the base on the contour formation portion so that the dummy terminal faces the external electrode terminal.

11) In the piezoelectric vibrator assembly process, the piezoelectric vibrator is produced by bending the a portion of the lead connected the insulated connection of the lead frame at a predetermined angle before capping a case and correcting the bent portion of the lead so that the portion is at an original angle thereof.

12) The piezoelectric vibrator described above is connected to an integrated circuit as an oscillation element in the oscillator according to the present invention.

13) In addition, the piezoelectric vibrator described above is connected to the timekeeping section in the electronic unit according to the present invention.

14) Also, the piezoelectric vibrator described above is connected to the filter section in the wave timepiece according to the present invention.

According to the present invention, in both the airtight terminal production process and the piezoelectric vibrator assembly process performed to produce piezoelectric vibrators, the same lead frame is used and to achieve flowability, thus proving effects described below.

In the airtight terminal production process, airtight terminals are arranged and held on the lead frame, thus allowing great improvements in yield in the plating step. In the present invention, the lead is connected to the base and airtight terminals are kept at constant intervals. In the plating step, there are no leads connected together through plating and the value for lead intervals is always kept constant. It is possible to greatly reduce the number of short circuit failures due to leads connected together through plating.

It is possible to use individual complete airtight terminals each insulated and connected to the base without separating any one of these airtight terminals from another in the piezoelectric vibrator assembly process. As a result, operations such as airtight terminal arrangement and mounting on pallet jigs can be eliminated completely, which operations require a large quantities of facilities and much labor at the first step in a related-art piezoelectric vibrator assembly process. In addition, it is possible to prevent metal particles on airtight terminals and lead bends in arrangement operations, thus allowing improvements in quality.

In addition, the piezoelectric vibrator assembly process, the lead of the airtight terminal is connected to the base of the conductive lead frame through an insulated material. This makes it possible to prevent electrical interference between piezoelectric vibrators even if a plurality of airtight terminals are connected to the conductive lead frame. The electrical property adjustment step and the sorting step can therefore be performed independently at the same time during the piezoelectric vibrator assembly process without any electrical influences on adjacent piezoelectric vibrators arranged.

Moreover, each lead frame to flow can be made of a material having good heat resistance and low gas release characteristics. A high level of vacuum can be maintained even at the baking step and the capping (sealing) step during the piezoelectric vibrator assembly process: the former step and the latter are performed at high temperatures and at high temperatures in a vacuum atmosphere, respectively. Therefore, there are an increase in degree of vacuum in the airtight space and a controlled amount of gases released inside the members even after airtight sealing, thus allowing improvements in piezoelectric vibrator quality.

Besides the two steps described above, those lead frames that are through with the piezoelectric vibrator assembly process are caused to flow even at the resin shaping process, thus proving effects described below.

In the resin shaping process, the conventionally required step of positioning piezoelectric vibrators on a dedicated lead frame and welding leads thereof to the lead frame can be eliminated in a transfer from the piezoelectric vibrator assembly process to the resin shaping process. The quality of piezoelectric vibrators can also be improved because of reduced drop in yield due to welding failures. In addition, it is possible to eliminate the conventionally required step of plating the external terminals of piezoelectric vibrators shaped. As described above, an entire group of lead frames can be inspected at one time without any electrical influences on adjacent piezoelectric vibrators arranged even in the sorting step for piezoelectric vibrators molded of resin. Therefore, the piezoelectric vibrator production method according to the present invention is greatly superior to a related-art method in time for work supply and discharge and positioning time; in the related-art method, individual vibrators are cut off from the lead frame and making measurements of electrical properties. Therefore, it is possible to reduce tact time for the resin shaping process.

As described above, the present invention greatly contributes to a reduction of lead time for the entire piezoelectric vibrator production process and allows improvements in piezoelectric vibrator quality as well. The same conductive lead frame that has been used in the airtight terminal production process is used consistently even at the resin shaping process. This eliminates the need for pallets and dedicated lead frames for use at both the piezoelectric vibrator assembly process and the resin shaping process, thus providing remarkably great cost reduction effects and therefore great industrial values.

BRIEF DESCRIPTION OF THE DRAWINGS

FIG. 21 is a production flow chart for a related-art airtight terminal;

DETAILED DESCRIPTION OF PREFERRED EMBODIMENTS

Embodiments according to the present invention will be described in detail with reference to the drawings.

First Embodiment

As a first embodiment according to the present invention, an example of a piezoelectric vibrator production will described below, where airtight terminals are arranged and held on the same lead frame for consistent flow during the airtight terminal production process and the piezoelectric vibrator assembly process. Note that in this embodiment, an example of a quartz crystal vibrator having a vibrating piece made of quartz crystal will be described below. However, other piezoelectric materials such as lithium tantalate ($LiTaO_3$) and lithium niobate ($LiNbO_3$) may be used, for example.

[Airtight Terminal Production Process]

Figure 1:
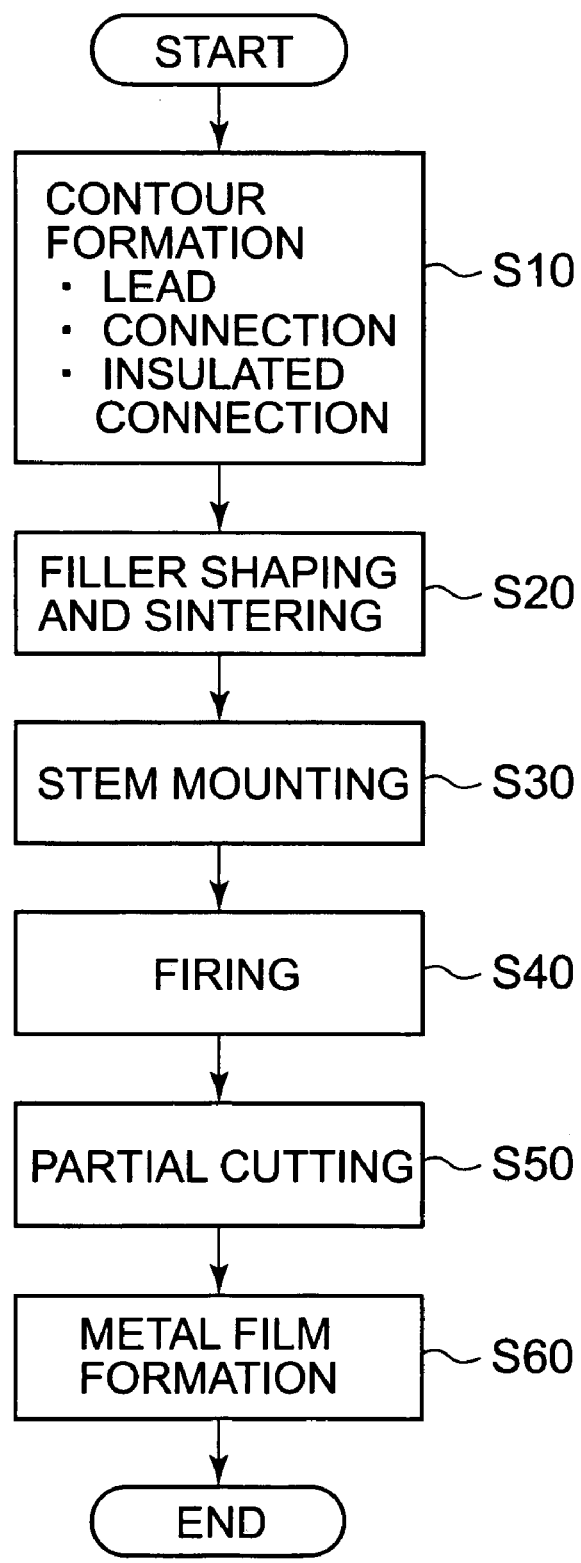
FIG. 1 is a schematic flow chart showing an example of an airtight terminal production process according to a first embodiment of the present invention.

The outline of the airtight terminal production process will be first described below with reference to FIG. 1. FIG. 1 is a flow chart showing the outline of one example of an airtight terminal production process according to a first embodiment.

As shown in FIG. 1, airtight terminals are produced as described below. A contour formation step of selecting a plate- or strip-shaped conductive material for a lead frame and forming contours of the lead of an airtight terminal on the lead frame is performed (step 10). In this contour formation step, not on the contours of the lead but also connections and insulated connections, which are required for subsequent airtight terminal configuration steps, are formed at the same time.

A filler shaping and sintering step (step 20) of filling the lead having the contours thereof formed with the filler in a predetermined position and shaping the filler, filling the lead with the filler and shaping the fill to connect the one end of the lead to a protruding portion constituting a non-base side of the insulated connection having the contours thereof formed, and sintering the two fillers shaped is then performed.

A stem mounting step (step 30) of mounting a stem on a circumference of the fillers sintered, which filler sintered is located on the lead, is then performed.

A firing step (step 40) of heating, melting and cooling the filler in the stem and the filler at the insulated connection is then performed.

A partial cutting step (step 50) of separating one end of the lead from a connection region and base of an inner lead cutting off a portion connected to the base of the lead by means of cutting is further performed.

Finally, a metal film formation step (step 60) of forming a metal film on a surface of the lead and a surface of the stem is performed.

Figure 2:
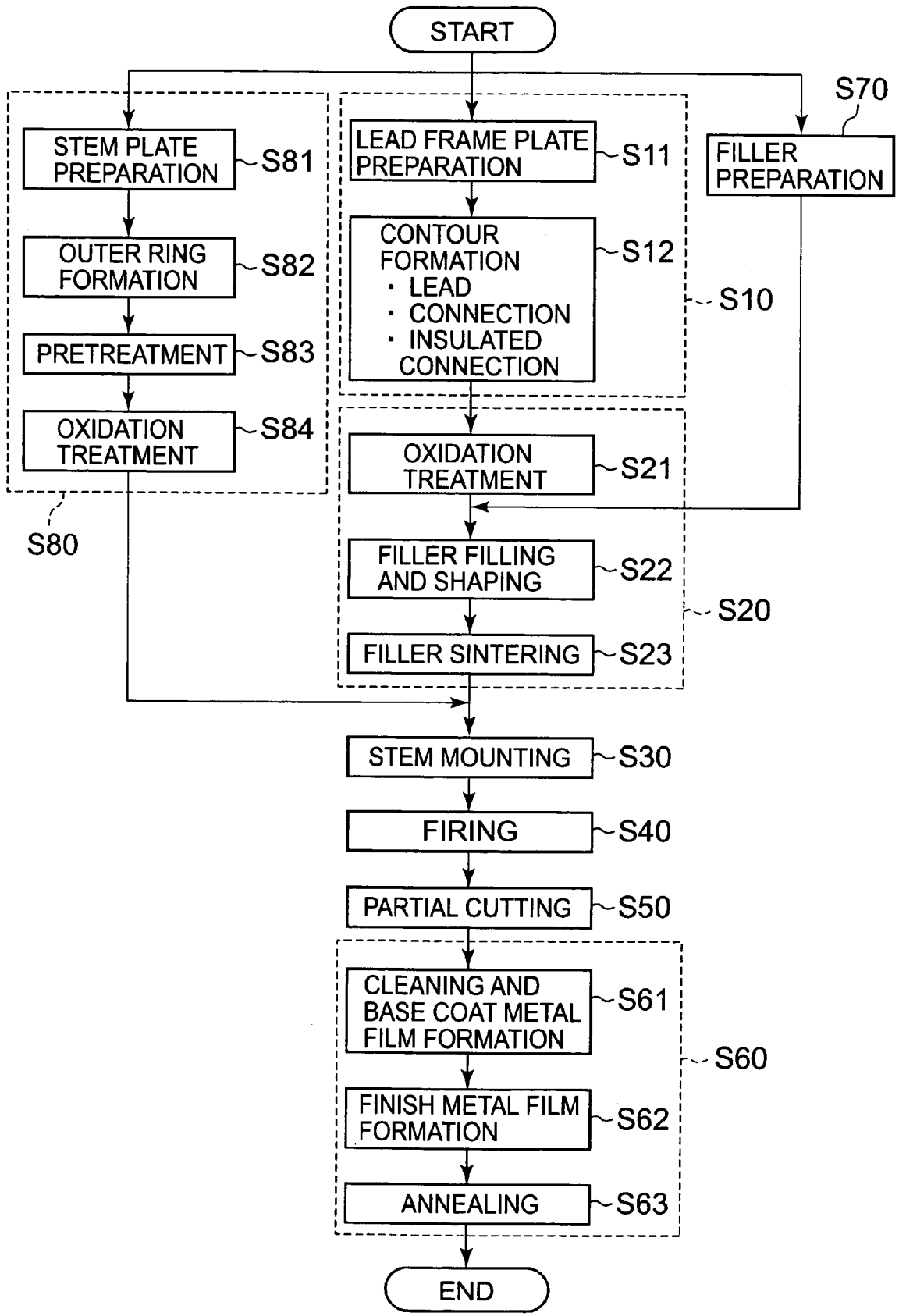
FIG. 2 is a detailed flow chart showing an example of the airtight terminal production process according to a first embodiment of the present invention.
Figure 3A:
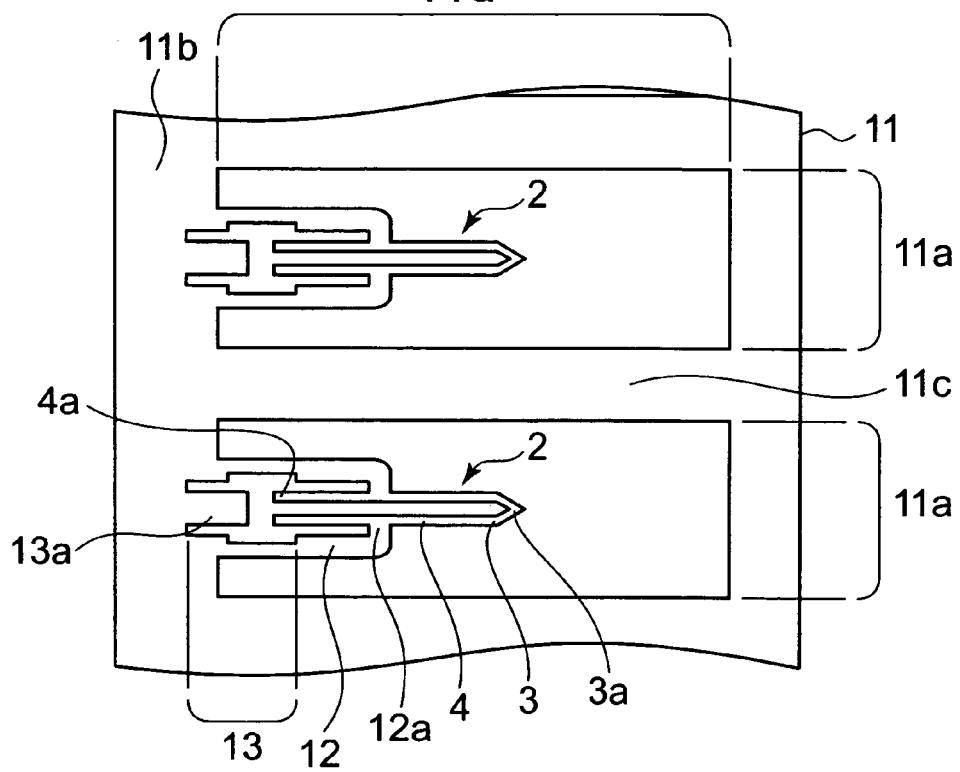
FIG. 3A is an explanatory diagram for a contour formation step in an airtight terminal production process according to the first embodiment of the present invention.
Figure 3B:
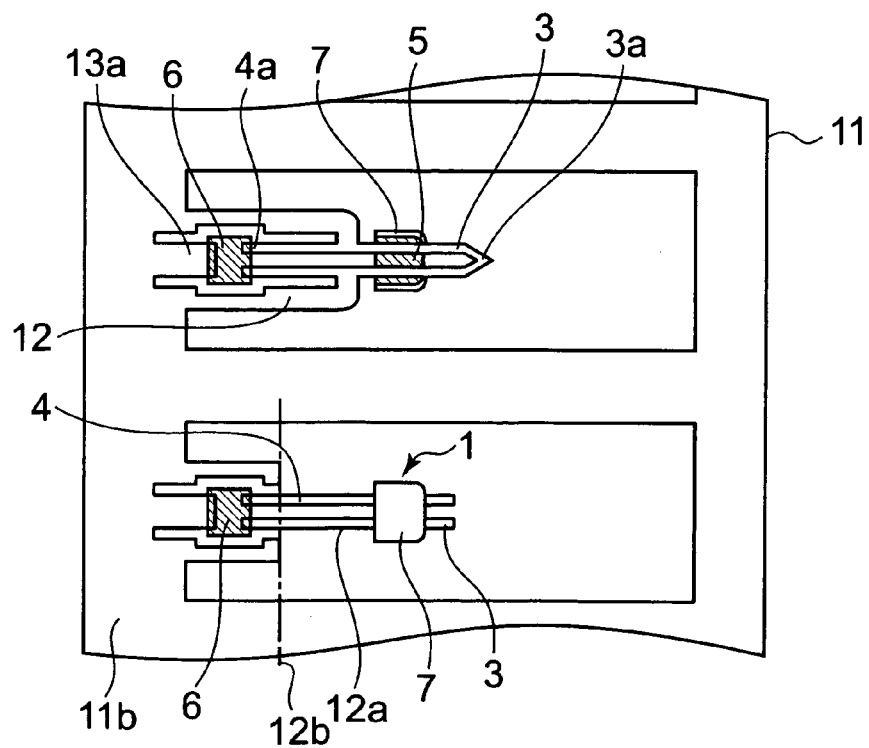
FIG. 3B is an explanatory diagram for a filler shaping and sintering step, the stem mounting step, and the partial cutting step in the airtight terminal production process according to the first embodiment of the present invention.

The airtight terminal production process classified into the six steps described above will be described in detail with reference to FIGS. 2 to 4. FIG. 2 is a flowchart showing substeps of the steps of the airtight terminal production process shown in FIG. 1. FIG. 3A is an explanatory diagram for the contour formation step in the airtight terminal production process. FIG. 3B is an explanatory diagram for the filler shaping and sintering step, the stem mounting step, and the partial cutting step in the airtight terminal production process.

Figure 4:
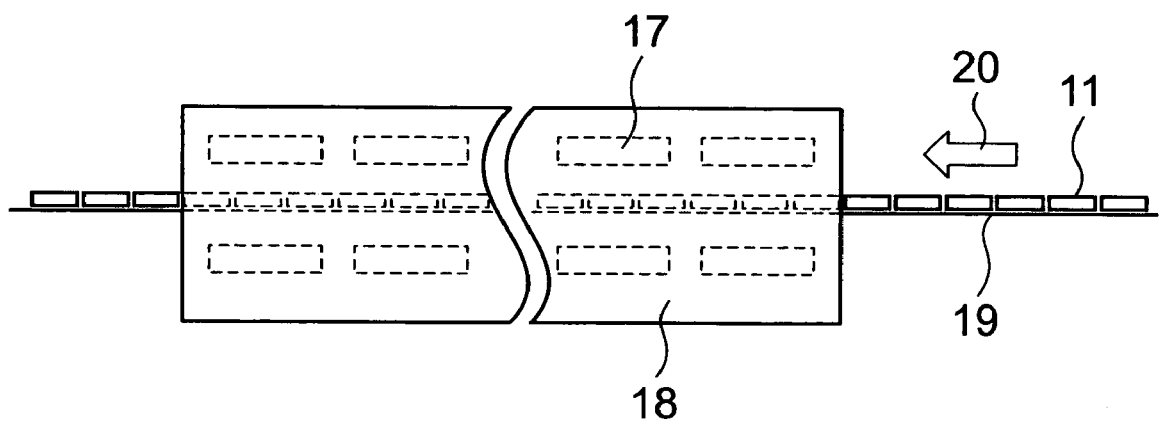
FIG. 4 is a pattern diagram showing a firing step in the airtight terminal production process.

FIG. 4 is an explanatory diagram for the firing step in the airtight terminal production process.

For a conductive material which the airtight terminal is made of, a plate material such as low carbon steel (Fe), alloy of ion and nickel (Fe—Ni), an alloy of ion, nickel, and cobalt (Fe—Ni—Co) is used. The plate material may be plate- or strip-shaped or hoop-shaped.

1) Contour Formation Step (Step 10)

In a contour formation step (step 10), a plate material is first prepared, which material is one of the materials described above and has an appropriate width (step 11). The plate material is referred to as a lead frame, depicted by a reference numeral 11.

As shown in FIG. 3A, a plurality of contour formation portions 11a each having a predetermined area and a base 11b adjacent to the contour formation portions 11a are disposed in predetermined positions and at predetermined intervals on the lead frame 11. Every contour formation portions 11a adjacent to each other are separated from one another by a section bar 11c to ensure the strength of the lead frame 11. A lead 2 with one end thereof connected to the base 11b through a connection portion 12 and a contour of an insulated connection 13 on a side base 11b side corresponding to the lead 2 are formed in the range of each contour formation portion 11a. These contours are formed by means of mechanical operations such a press work, laser processing, or chemical operations such as etching (step 12).

As a result, the contour of the lead is formed with one end of the lead 2 connected to the base 11b through the connection portion 12. After the steps described above, at the contour formation portion 11a of the lead frame 11 a plurality of contours of leads 2 connected to the base 11b and the contours of insulated connections 13 corresponding to these leads 2 are arranged at predetermined intervals.

The lead 2 and the insulated connection 13 will be then described in more detail with reference to FIG. 3A. Of two thin bars formed at the contour formation portion 11a of the lead, the end of one bar is connected and the end of the open opposite bar is open. Each of the right and left branching portions branching off from the sides of the lead 2 is connected to the base 11b. In this embodiment, one branching portion connected to the base 11b is referred to as a connection portion, depicted by a reference numeral 12. A portion of the connection portion 12 that branches off from an outer lead 4 is referred to as a branching point, depicted by a reference numeral 12a.

In the present invention, the open end 4a of the outer lead and the protruding portion 13a protruding from the base side facing the open end 4a of the outer lead to the contour formation portion together are referred to as an insulated connection, depicted by a reference numeral 13. As will be described later in the next step, the insulated connection 13 is filled with a filler 6 so that open end 4a of the outer lead is connected to the protruding portion 13a by means of an insulative filler and the filler is shaped. The filler 6 is fired at Step 40 and the open end 4a of the outer lead is mechanically and fully connected the protruding portion 13a with no problem.

The connection portion 12 serves to keep the lead 2 connected to the base 11b for retaining purposes until the insulated connection 13 can mechanically connect the open end 4a of the outer lead to the protruding portion 13a, which is connected to the base 11b with no problem. Therefore, the connection portion 12 is cut off in the step 50 of the airtight terminal production process and the lead 2 is mechanically held on the base 11b through the insulated connection 13 only.

The insulated connection 13 also serves to keep the lead 2 connected to the base 11b until the final step of the piezoelectric vibrator assembly process, which will be described later. As described above, the lead is electrically insulated from and mechanically connected to the base 11b in the ongoing steps during the production of parts of the piezoelectric vibrator. This makes it possible to perform the subsequent steps of the piezoelectric vibrator assembly process with good efficiency. For example, airtight terminals 1 are assigned to each of the plurality of bases 11b of the lead frame 11 made of a conductive material. A plurality of piezoelectric vibrators each having a vibrating piece 8 bonded to the airtight terminal 1 can pass through a resonance frequency trimming step and a sorting step without any mutual electrical interference between one of adjacent piezoelectric vibrators and another.

In this embodiment, each lead 2 is formed to have the ends of the inner lead 3 connected to each other. Forming each lead 2 in the manner described above makes it for two inner leads to share a load imposed on the lead 2. This therefore makes each lead difficult to bend, thus making it possible to prevent a drop in parallelness between two inner leads, which form a pair. The width of the inner lead can be partially changed.

In addition, the lead is provided with a convex filler positioning portion (not shown) for positioning a filler 5 which, fills the lead 2 in a predetermined position and is shaped in a subsequent step. Note that the filler positioning portion may be shaped to have a step that allows the mechanical positioning of the filler.

In FIG. 3A, the outer lead 4 is shown to have the same width as the inner lead 3. The width of the outer lead 4 may be larger than the width of the inner lead 3, which provide the lead 2 rigidity, thus making is possible to prevent the outer lead 4 from bending during the airtight terminal production process.

In this embodiment, the section bar 11c is provided to separate one airtight terminal from another. However, the section bar 11c can be provided to separate a group of more than one airtight terminal from another in the allowable range of the strength of the lead frame 11. Producing a plurality of airtight terminals in each contour formation portion 11a with a larger area could provide a larger number of airtight terminals produced per unit area, thus resulting in larger production efficiency.

2) Filler Shaping and Sintering Step (Step 20)

In a filler shaping and sintering step (step 20), Oxidization treatment is first performed on the lead frame 11 through with the contour formation step to enhance adhesiveness between the lead frame and the filler, which the lead will be filled with later (step 21). Each of the leads 2 and the insulated connection 13 is then filled with the filler. For the material of the filler, Soda lime glass, soda barium glass, borosilicate glass and the like are selected. For example, borosilicate glass powders are prepared (step 70). The lead 2 is filled with the powders in a predetermined position and the insulated connection 13 is filled with the filler with a mold disposed.

The filler shaping and sintering step will be then described below with reference to FIG. 3B. Of two airtight terminals shown in FIG. 3B, the airtight terminal on top is shown for description in concert with this step and the next step (step 30). In FIG. 3B, the filler in the lead 2 is depicted by a reference numeral 5 while the filler in the insulated connection 13 is depicted by a reference numeral 6. These fillers are shaped by pressurizing the powders (step 22). These two fillers 5 and 6 are then sintered in an atmosphere with a temperature of 750° C. or so. At this step, the fillers 5 and 6 are not in close contact with each of the leads 2 as well as the open end 4a and the protruding portion 13a, which together constitutes the insulated connection 13, leaving a slight clearance therebetween (step 23).

3) Stem Mounting Step (Step 30)

The next step is a stem mounting step (step 30). A stem 7 is first inserted into the lead through an inner lead connection region 3a as shown in FIG. 3B. The stem 7 has been produced in a step different from the step described above where contours are formed on the lead frame 11. The stem 7 is then mounted on the outside of the filler 5 sintered. The different step (step 80) where the stem is produced will be described below. A plate material for a stem is prepared (step 81). For the material of the stem, a material such as low carbon steel, alloy of ion and nickel, an alloy of ion, nickel, and cobalt is used, as described above. Outer rings are then formed from a large number of plate materials made of any of the material described above through simultaneous blanking on a press, for example (step 82). Pretreatment such as acid cleaning and reduction treatment is then performed (step 83). Oxidization treatment is then performed to enhance adhesiveness between the stem and the filler 6 (step 84). Each of the stems 7 thus produced is then attached outside the filler 5 in the lead 2.

Note that in FIG. 3B, the airtight terminal on top and the airtight terminal at the bottom are shown as if these two airtight terminals were produced in a different step. This is for the convenience of description. In an actual production process, in case of a plate-shaped lead frame, a plurality of airtight terminals in a single lead pass through each of the same steps so that these airtight terminals are in the same state. In case of a lead frame shaped like a strip or a long hoop, local adjacent airtight terminals may look different as shown in FIG. 3B if these airtight terminals are connected to the lead frame among units used in individual steps of the production process.

4) Firing Step (Step 40)

The next step is a firing step (step 40). Firing is performed according to a predetermined temperature pattern by which the filler is molten and the filler is allowed to cool to room temperature. This causes both the filler 5 and the lead 2 and both filler 5 and the stem 7 to be completely sealed to each other, thereby providing a construction that can withstand airtightness. In addition, the filler 6 is completely sealed to the open end 4a of the outer lead and to the protruding portion 13a, which makes the lead 2 rigidly connected to the base 11b through the insulative filler 6.

FIG. 4 is a pattern diagram showing the firing step. In FIG. 4, a reference numeral 18 depicts an electric furnace and a reference numeral 17 depicts a heater. The electric furnace 18 is set to a temperature of 1000° C. or so by means of the heater 17. A plurality of lead frames 11 through with the stem mounting step are moved by means of a carrier unit 19 at a predetermined inching speed in the direction of the arrow 20 over a long distance in the electric furnace 18, which is hot, at a temperature of 1000° C. or so. While each of the leads is moved through the hot electric furnace 18, the fillers 5 and 6 are heated and molten. The lead frames 11 are moved through and leaves the electric furnace 18 and are allowed to cool gradually to room temperature. During gradual cooling, the fillers 5 and 6 solidifies and comes into very close contact with the corresponding metals.

5) Partial Cutting Step (Step 50)

The next step is a partial cutting step (step 50) of cutting off a portion of a region with contours formed thereon. This step will be described below with reference back to FIG. 3B in terms of the airtight terminals at the bottom. There are two cutting points. One cutting point is at the connection region 3a of the inner lead. In this cutting step, one of the pair of two inner leads 3 is separated from the other. The airtight terminal 1 shown in FIG. 3B is shown to have one portion of the connection region 3a of the inner lead 3 separated from the other.

The other cutting point is at the connection portion 12, which branches off from the lead 2 and is connected to the base. As described above, the connection portion 12 has already finished its own role. The connection portion 12 is cut along the alternate long and short dash line passing through the cutting point. This electrically and completely separates one of the pair of inner leads of the leads of the airtight terminal from the other. Thus, the lead is mechanically fixed to the base 11b of the lead frame 11 by means of the insulated connection 13 only. Therefore, one of the adjacent airtight terminals 1 is electrically insulated from the other airtight terminal 1.

Note that in this embodiment the partial cutting step is performed before a metal film formation step for the purpose of forming a metal film on the cut surface of the connection region 3a of the inner lead 3 as well. In any application where no metal films need to be formed, the partial cutting step can be performed after the metal film formation step (step 60). Note that the connection region 3a of the inner lead 3 can be cut off not only for cutting purposes but also to provide the inner lead 3 a variety of shapes at the same time.

6) Metal Film Formation Step (60)

A metal film is then formed on the outer peripheral surfaces of the lead 2 and stem 7 (step 60). An example of a case where metal films of the same material are applied by means of a wet plating method will be described below. The lead frames are entirely cleaned first (step 61). The lead frames 11 are arranged and immersed in a plating bath to apply base coat plating to each of the leads 2 and stems 7 on electroplating conditions appropriately selected. The lead 2 and stem 7 are plated with one of Cu, Ni and the like selected for a coat plating material to a thickness of approximately 2 to 5 μm or so. For finish plating, a plating material and a method are then selected from a single material such as tin (Sn) and silver (Ag), an alloy of tin and lead (Sn—Pb), an alloy of tin and bismuth (Sn—Bi), an alloy of tin and antimony (Sn—Sb), an alloy of tin and copper (Sn—Cu), and plating of an alloy of tin and copper followed by Ag plating. The lead 2 and stem 7 are then plated with any selected one of the above materials to a thickness of approximately 8 to 15 μm (step 62).

In the metal film formation step, airtight terminals are arranged at constant intervals at the base 11b of the lead frame 11. It is therefore possible to fully control the occurrence of pairs of two leads connected together through plating and contact of one lead 2 with another due to a reduction in airtight terminal size. This therefore makes it possible to solve the problem of a great drop in yield found in a related-art barrel plating step. Even if there is a further reduction in size of the airtight terminal 1, the method according to the present invention makes it possible to control a drop in yield in a plating step. After the end of plating, the plating film is stabilized by means of annealing (step 63).

In the above metal film formation step, a method for forming a metal film by means of wet plating has been taken as an example of a metal film formation method. However, the method of forming a metal film is not limited to only wet plating. For example, various film formation methods such as vapor-phase growth, vapor deposition, sputtering, and ion plating can also be utilized.

The steps described above are included in the airtight terminal production process. Through these steps the airtight terminals 1 are arranged at constant intervals on the lead frame 11. Each of the airtight terminals 11 is connected to the base 11b via the insulated connection 13 such that it is electrically insulated from the surrounding area. Accordingly, the airtight terminal is in the state that it can be thrown into a piezoelectric vibrator assembly process, which is the subsequent step, and therefore the airtight terminal can be continuously flowed into the airtight terminal production process and the piezoelectric vibrator assembly process on the same lead frame 11. In addition, since the component material is only the filler mainly composed of a metal and glass, release gas can satisfactory be suppressed even when it suffers heating at a temperature exceeding 200° C. by baking, sealing and the like in the assembly process. Therefore, the problem in the quality caused by release gas in the airtight space that has became remarkable in accordance with miniaturization of the piezoelectric vibrator, that is, fluctuations in resonance frequency and resonant resistance values of the piezoelectric vibrator can be suppressed.

A method for producing vibrating pieces, important members that constitute piezoelectric vibrators other than airtight terminals, will be described below with reference to FIG. 5.

[Vibrating Piece Production Process]

Figure 5:
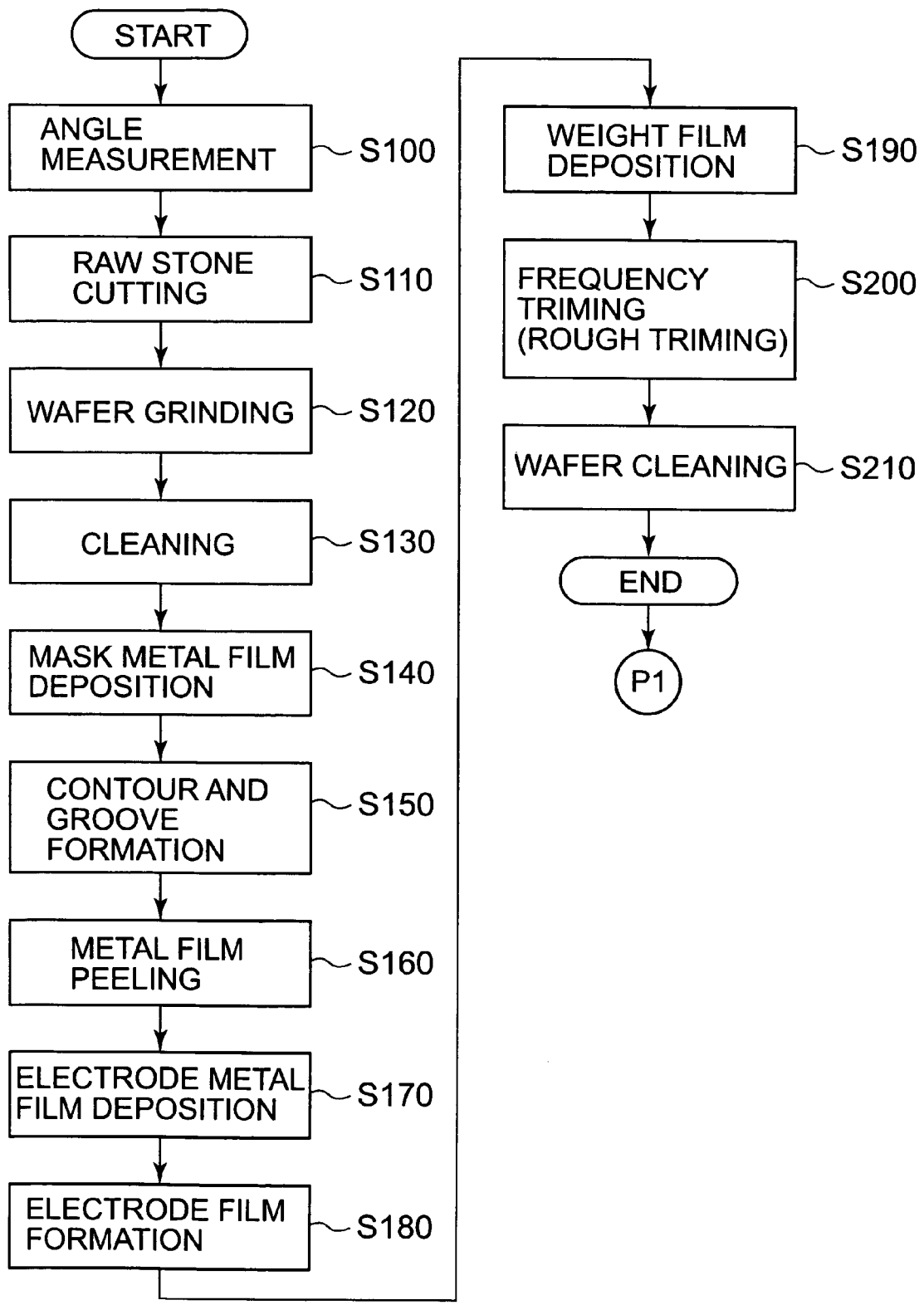
FIG. 5 is a production flow chart showing an example of a piezoelectric vibrating piece production process according to the present invention.

FIG. 5 is a production flow chart showing a vibrating piece production process according to the present invention. In the vibrating piece production process, as shown in FIG. 5, Lambard quartz raw stone is first set on a work table using an X-ray diffraction method during angle measurement to obtain a predetermined cutting angle (step 100). The quartz raw stone is then sliced into pieces each having a thickness of approximately 200 μm, using a cutting apparatus such as a wire saw, for example. Each of the quartz raw stone slices serves as a quartz wafer. This quartz crystal wafer is simply hereinafter referred to as a "wafer." Usually, free abrasive grains are commonly used for cutting the raw stone. A high carbon steel wire having a diameter of approximately 160 μm, for example, is used as a cutting wire (step 110).

Wafers are then ground to a constant thickness. For grinding, rough lapping is usually performed using free abrasive grains with a large grain size. Finish lapping is then performed using free abrasive grains with a small grain size. Etching is then performed on the surface of each wafer and any resultant transubstantial layer is removed from the surface of the wafer, which is then polished to obtain a finished mirror surface having a predetermined thickness and a predetermined flatness (step 120). The thickness of the wafer is smaller as the size of the vibrating piece is smaller. The thickness of the wafer will be approximately 50 μm if the full length of the vibrating piece is 1600 μm.

Each wafer is washed in pure water or super pure water (step 130). The wafer is then dried and a metal film for masking having a predetermined thickness is deposited to the surface of the wafer by means of sputtering or the like to form a contour of a vibrating piece. Metal materials to be used are chrome and gold, which are commonly used for this purpose. The thin metal film is a deposited film where the surface of chrome as a base coat is coated with a gold film. Chrome has good adhesiveness with quartz crystal. The metal film for a mask is deposited on both surfaces of the wafer (step 140).

A plurality of vibrating piece contours are then formed on the wafer through photolithography technology. The vibrating piece is shaped a tuning fork having two vibration arms. Specifically, resist is applied to the quartz crystal vibrator and both of the surfaces of the quartz crystal vibrator are exposed through a contour mask. The quartz crystal vibrator is then developed to obtain the resist pattern of the contour of the quartz crystal vibrator. Any unwanted metal patter is then removed from the quartz crystal vibrator using an etching solution to obtain a metal mask pattern. The resist is removed from the quartz crystal vibrator and the quartz crystal is etched in a hydrofluoric acid solution to form a plurality of vibrating piece contours on the wafer. The value for the ratio between the width of the vibration arm and the thickness of the vibration arm (the width of the vibration arm/the thickness of the vibration arm) is usually smaller as the size of the vibrator is smaller. If the ratio is smaller than 1.0, the electric field efficiency relates to the vibration arm of the tuning fork type quartz crystal vibrator lowers and the value for resonant resistance for the vibrator increases. The value for resonance resistance will increase above 100 kΩ, for example, thus making the tuning fork type quartz crystal vibrator undesirable as a vibrator. To prevent the rise in resonant resistance, a groove is formed in the vibration arm to increase the electric field efficiency and reduce the value for the resonant resistance (step 150).

After the contours and the groove are formed as described above, all the metal film used as a mask is stripped from the wafer (step 160). A metal film having a predetermined thickness, which serves as a electrode film, is then deposited to both surfaces of the wafer again through sputtering and the like (step 170). If the groove described above is already formed, the metal film is also formed on the inside surface of the groove. After film deposition, an electrode film pattern is formed using lithography technology as with step 150, the contour formation step described above (step 180).

A film having a thickness of a few micrometers, which serves as a weight, is then formed in the tip region of the vibration arm of the wafer with the electrode film pattern formed thereon (step 190). As the material of the film for use as a weight, chrome and silver or gold are commonly used for a deposited layer.

The next step is a frequency trimming step (rough trimming) The weight section is irradiated with a laser in the atmosphere. While measuring the oscillation frequency, a portion of the weight film deposited in the preceding step is evaporated to adjust the frequency to a predetermined range (step 200).

After frequency trimming, the ultrasonic cleaning of the wafer is performed to remove residues of the film rising from frequency trimming and foreign matter from the wafer (step 210) The step provides complete wafers each having a plurality of vibrating pieces. Each of the individual vibrating pieces cut off from the wafer is depicted with a temporary symbol P1 in FIG. 5, and readied for the next process, the piezoelectric vibrator assembly process.

The piezoelectric vibrator assembly process will be described below with reference to FIGS. 6 and 7. In the piezoelectric vibrator assembly process, the airtight terminals 1 connected to the lead frame 11 produced by the airtight terminal production process described above and vibrating pieces P1 produced in the vibrating piece production process to assemble piezoelectric vibrators.

[Piezoelectric Vibrator Assembly Process]

Figure 6:
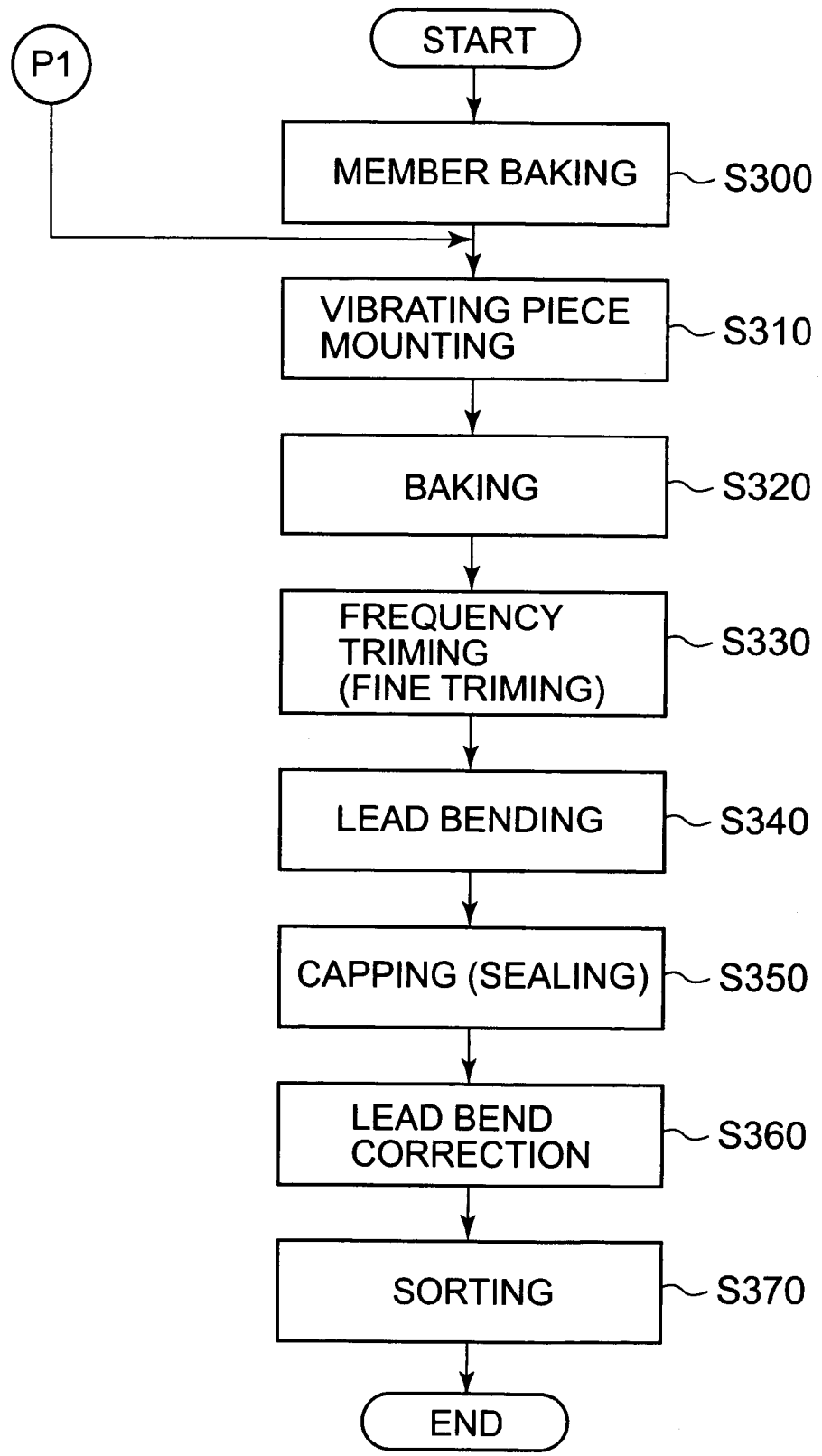
FIG. 6 is a flowchart showing an example of a piezoelectric vibrator assembly process according to the present invention.
Figure 7A:
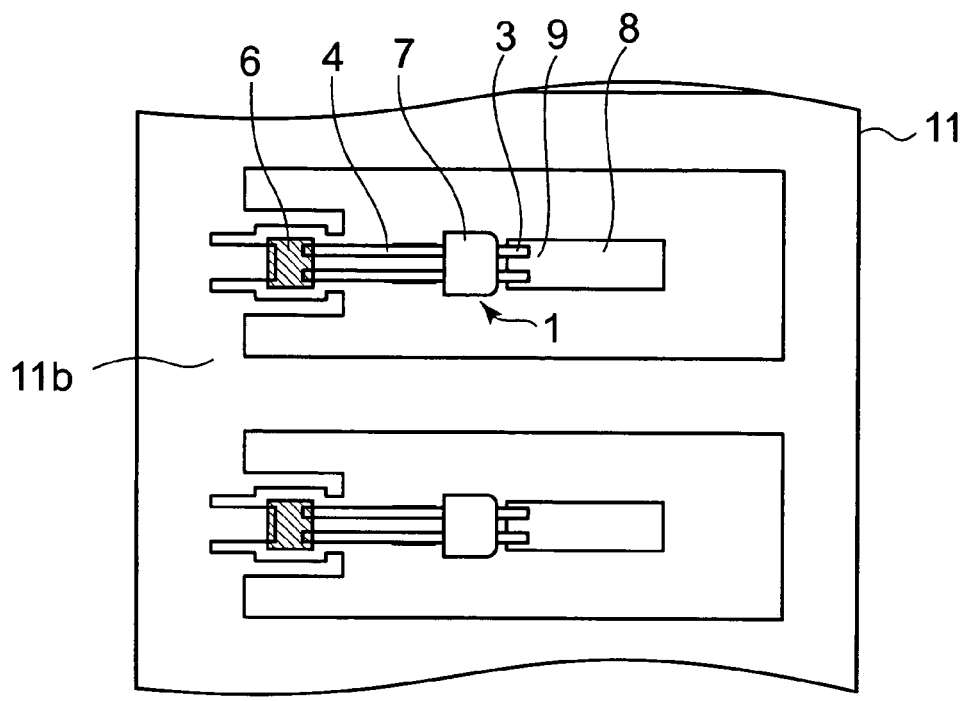
FIG. 7A is a diagram showing piezoelectric vibrators after a vibrating piece mounting step in a piezoelectric vibrator assembly process according to a first embodiment of the present invention.
Figure 7B:
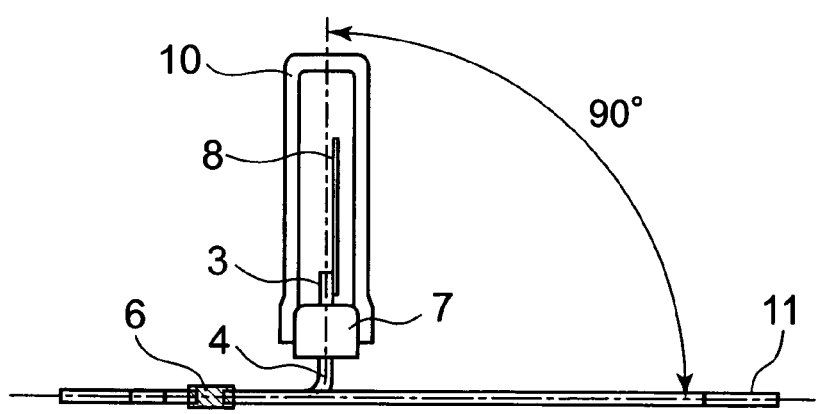
FIG. 7B is a diagram showing piezoelectric vibrators after a capping step in the piezoelectric vibrator assembly process according to a first embodiment of the present invention.
Figure 7C:
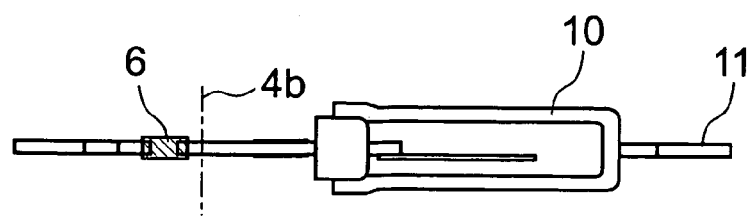
FIG. 7C is a diagram showing piezoelectric vibrators after a capping step in the piezoelectric vibrator assembly process according to a first embodiment of the present invention.

FIG. 6 is a flow chart showing a piezoelectric vibrator assembly process according to the present invention. FIG. 7A is a diagram showing piezoelectric vibrators after a vibrating piece mounting step in the piezoelectric vibrator assembly process. FIGS. 7B and 7C show piezoelectric vibrators after the capping step in the piezoelectric vibrator assembly process.

In the first step in the piezoelectric vibrator assembly process, as shown in FIG. 6, members are baked (step 300). Lead frames 11 with airtight terminals arranged thereon through insulated connections and cases 10 are sufficiently heated at a high temperature in a vacuum to remove or release moisture absorbed many gas components from members. Note that cases for use in the first step are produced by pressing and plating each nickel silver sheet with a finish coat or pressing each nickel silver sheet plated in advance, as described above.

Figure 22:
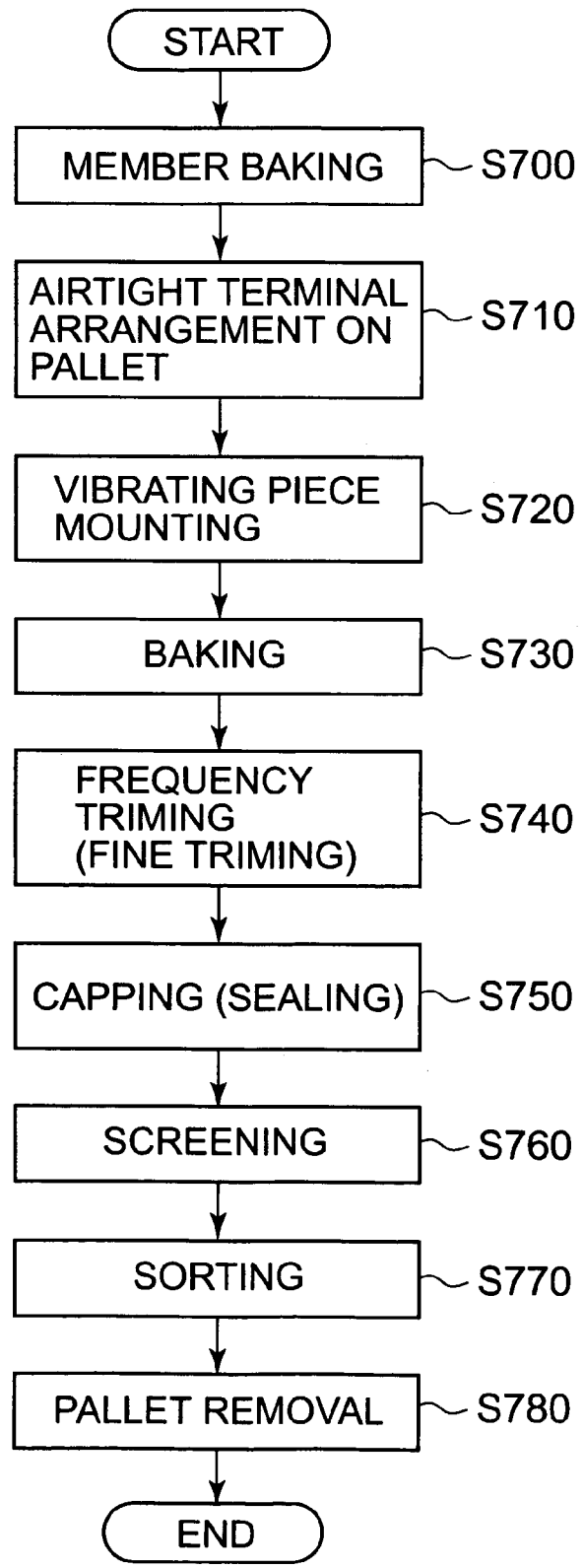
FIG. 22 is a production flow chart for a related-art piezoelectric vibrator assembly process.
Figure 23:
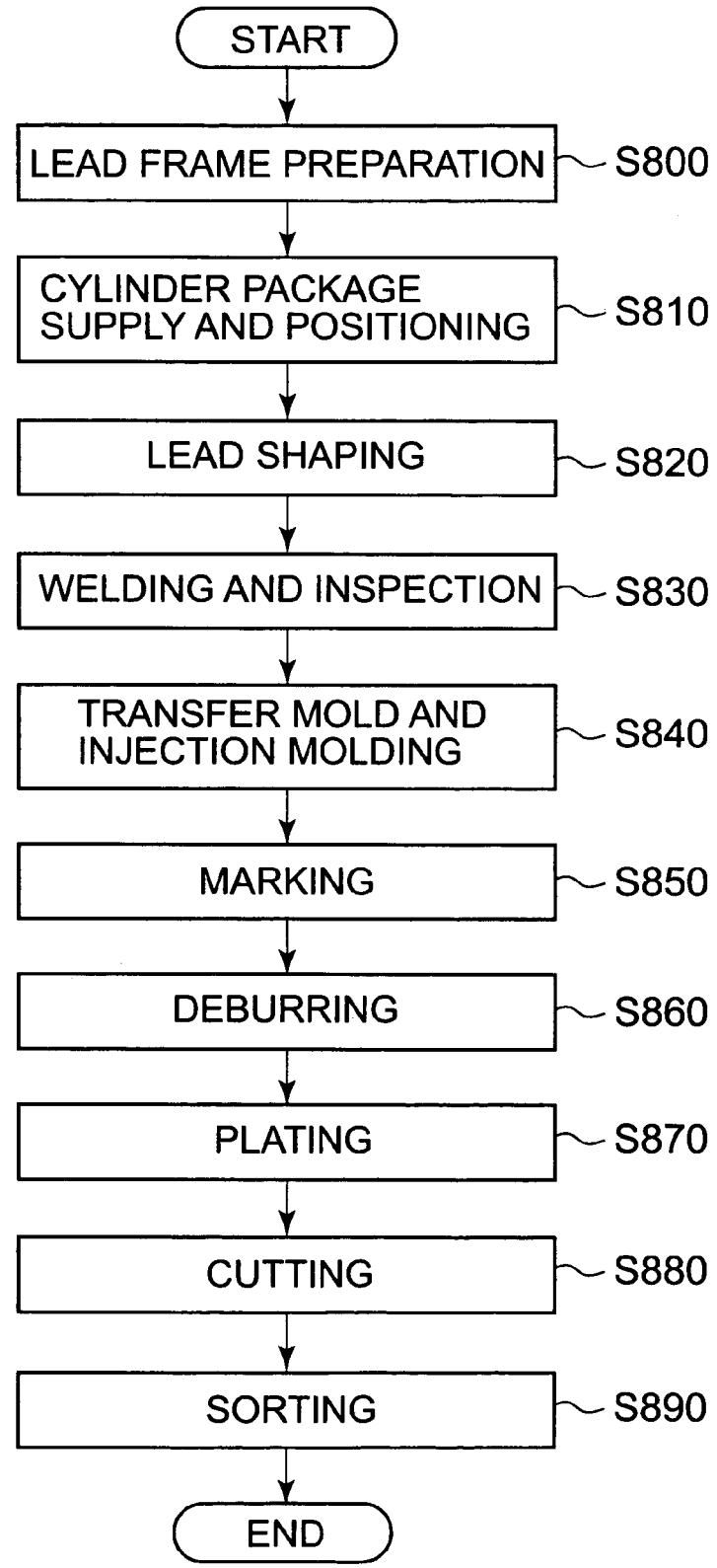
FIG. 23 is a production flow chart for a related-art resin shaping process.
Figure 24:
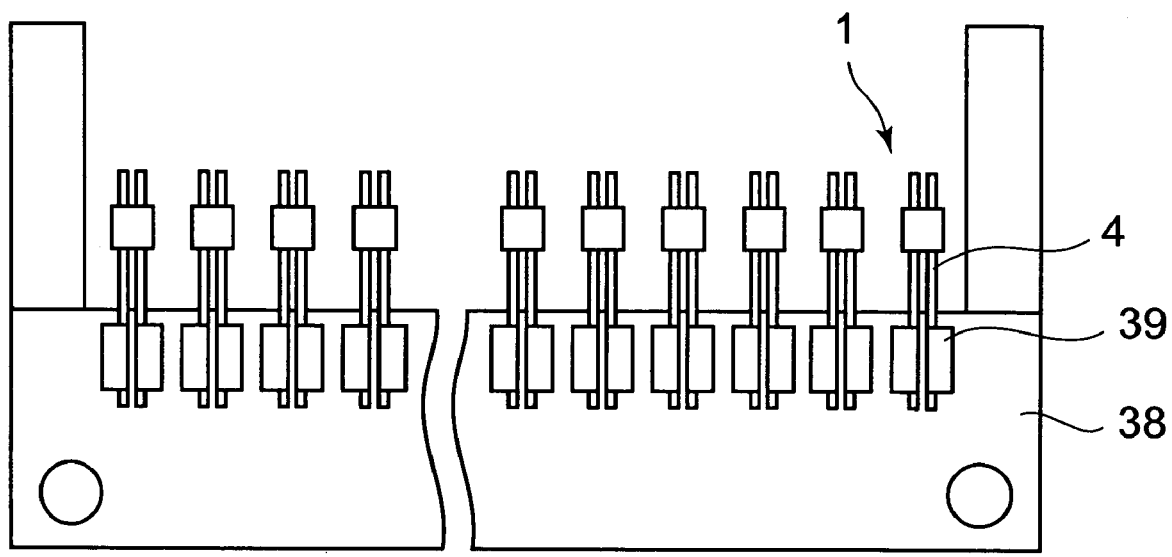
FIG. 24 is a pattern diagram showing the arrangement of a related-art pallet and related-art airtight terminals.
Figure 25A:
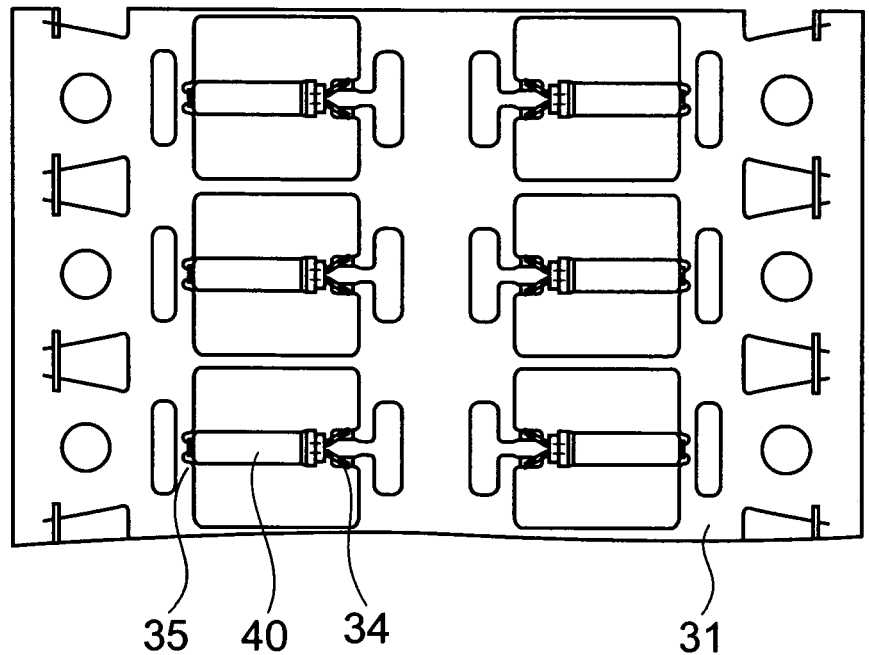
FIG. 25A is a plan view of a plurality of piezoelectric vibrators arranged on a related art lead frame.
Figure 25B:
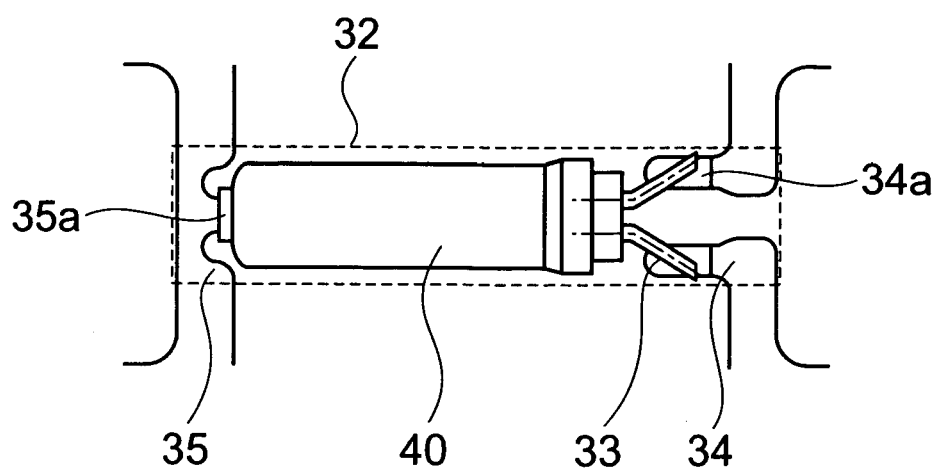
FIG. 25B is a fragmentary enlarged view of the piezoelectric vibrator of FIG. 25A.

The first step in the piezoelectric vibrator assembly process eliminates the need for a step for arranging airtight terminals on a pallet (step 710 in FIG. 22), a step required in a related-art piezoelectric vibrator assembly process. In addition, the first step provides a great reduction in manpower and allows reduction in lead time. The member baking step also provides great effects in quality. Namely, a vibration means is required to arrange airtight terminals provided with leads in some direction if these airtight terminals are automatically mounted by a mechanical means. The present invention eliminates a failure such as bends in leads of airtight terminals contacting each other due to resulting vibrations. Conventionally there is a problem that fine metal particles on inner leads and stems and ultimately those particles adhere on vibrating pieces can easily cause oscillation frequency changes and oscillation failures; these particles result from contact of plating films peeled and the like. In this embodiment, however, it is possible to greatly control vibrator quality deterioration due to fine metal particles because of the absence of an airtight terminal arrangement step.

The next step is a vibrating piece mounting step. In, this step, the vibrating piece P1, shown at the end of the flow chart shown in FIG. 5, is bonded to the inner lead 3 of the lead frame 11 already baked (step 310). Note that the vibrating piece is depicted by a reference numeral 8.

The mount pad 9 of the vibrating piece 8 is mechanically aligned with the inner lead 3 and the plating on the inner lead 3 is molten by means of a heat source to connect the inner lead 3 to the mount pad 9. This permits a plurality of airtight terminals each having the vibrating piece 8 bonded thereto to be arranged on the lead frame 11, as shown in FIG. 7A. A heated inert gas, a laser, a light source and the like are used as a heat source. Alternately, the base metal itself of the inner lead 3 may be molten for bonding purposes. For example, a technique such as arc discharge heat can be utilized. Because of a reduction in size of vibrating piece 8 itself, the area itself of the mount pad 9 is extremely smaller. Therefore, the shape of the ends of the inner lead 3 is also important. As described above, inner leads 3 can also be shaped at the same time in the step 50 of the airtight terminal production process. Thus, the ends of the inner lead 3 can be made into various shapes. Note that the vibrating piece 8 shown in FIG. 7A is a rough version of a tuning fork type quartz crystal vibrator type. However, the shape of the vibrating piece 8 may be rectangular like an AT type vibrator.

After mounting on the inner lead 3, the vibrating piece 8 is baked at a predetermined temperature in a vacuum to remove any distortion in the vibrating piece 8 due to mounting (step 320).

Frequency trimming (fine trimming) is then made (step 330). In the frequency trimming step, the entire lead 11 is placed in a vacuum chamber. While measuring the frequency, the metal film on vibration arm of the vibrating piece 8 is then evaporated by means of a laser to adjust the frequency to a predetermined range. For probing for frequency measurement, the end of the probe is squeezed against the outer lead 4 for electrical continuity. The probing can performed simultaneously on the outer leads 4 of all the airtight terminals 1 on the airtight terminal 1 to increase the cycle time for frequency trimming. Even in this case, the individual airtight terminals 1 are mechanically connected to the base 11b of the lead frame by the insulated connection 13, with no mutual electrical interference between adjacent airtight terminals 1. Note that the metal film can also be removed from the vibration arm of the vibrating piece 8 by irradiating the vibration arm with argon ions to etch the metal film in addition to a laser.

As described above, the cases 10 are fully degassed in a vacuum in advance in the step 300 to store the case in an atmosphere with no moisture on the surface thereof. The cases 10 are then arranged on a dedicated jig with little release gas. The airtight terminals on the lead frame 11 are sealed after pretreatment in the next procedure. The frame of the lead frame 11 is pressed down by means of a jig and the outer lead 4 of every airtight terminal 1 on the lead frame 11 is bent to approximately 90°, for example (step 340). This causes all of the airtight terminals 1 to be arranged at approximately 90° to the lead frame 11 as shown in FIG. 7B. This makes it possible to prevent the upper frame of the airtight terminal 1 from interfering with sealing. Note that in performing this bending work, a jig needs to be used to prevent any external forces from be applied to the filler 6 on the insulated connection 13.

After the above bending work is performed on the outer leads 4 of the airtight terminals 1, a plurality of lead frames 11 are arranged on a sealing mold and cases 10 arranged are set in an opposite position. The mold positions the bottom of stem 7 of the airtight terminals 1, thus allowing accurate positioning. A plurality of molds each having a set of lead frames 11 and cases 10 thus prepared are charged into a vacuum chamber to sufficiently heat the lead frames 11 and remove moisture absorbed and gases from the members. After the vacuum reaches a predetermined pressure, the outside perimeter of the stem 7 of the airtight terminals 1 is press fit to the internal surface of the cases 10 by means of a mold. The vibrating piece 8 is airtight sealed in the vacuum by doing the above work (step 350). Removal of moisture absorbed and gases from the members by heating is extremely important for the production of small piezoelectric vibrators. The great importance of moisture and gas removal will be briefly described below.

A reduction in piezoelectric vibrator size first decreases the size of the vibrating piece 8 and then the sizes of the airtight terminal 1 and the cases 10, each of which serves as a package. This therefore decreases the calorific capacity of the piezoelectric vibrator as well, thus making the piezoelectric vibrator vulnerable to thermal changes therearound. For example, in a tuning fork type quartz crystal vibrator, resonance frequency and resonant resistance values are extremely sensitive to the pressure in a vacuum airtight space surrounding the vibrating piece. Under a thermal influence after sealing, the members in the airtight space release gases. A resulting rise in the pressure in the airtight space causes fluctuations in resonance frequency and resonant resistance values. Therefore, sufficient degassing work is required before sealing to keep the piezoelectric vibrator accurate over along period of time. The lead frames 11 according to the present invention are composed of only a metal and fillers (mainly containing glass) with sufficiently low release gas characteristics. The lead frames 11 according to the present invention are extremely preferred for the production of small piezoelectric vibrator.

After capping, the 90°-bent outer lead 4 of the airtight terminal 1 is returned to an original state so that airtight terminals 1 is a horizontal position (step 360). The airtight terminals 1 in a horizontal state are shown in FIG. 7C. The entire lead frames 11 are maintained at a constant temperature for frequency stabilization.

The resonance frequency and resonant resistance values as well as other electrical properties for the piezoelectric vibrator are then measured (step 370). Note that the individual airtight terminals are connected to and electrically insulated from the lead frame 11, as described above. Therefore, measurements can be made with a probe for sorting simultaneously in contact with a plurality of piezoelectric vibrators in a predetermined position of the outer lead 4 because there is no electrical interference among oscillating piezoelectric vibrators.

Finally, the individual vibrators are separated from the lead frame 11 by cutting. Cutting is done at one end of the outer lead 4, as shown in FIG. 7C. A cutting line for the outer lead is shown by an alternate long and short dash line depicted by a reference numeral 4b.

The cutting work described above ends the piezoelectric vibrator assembly process. Piezoelectric vibrators completed are then packaged in a predetermined shipping and delivery form using bagging, taping and the like.

Figure 8:
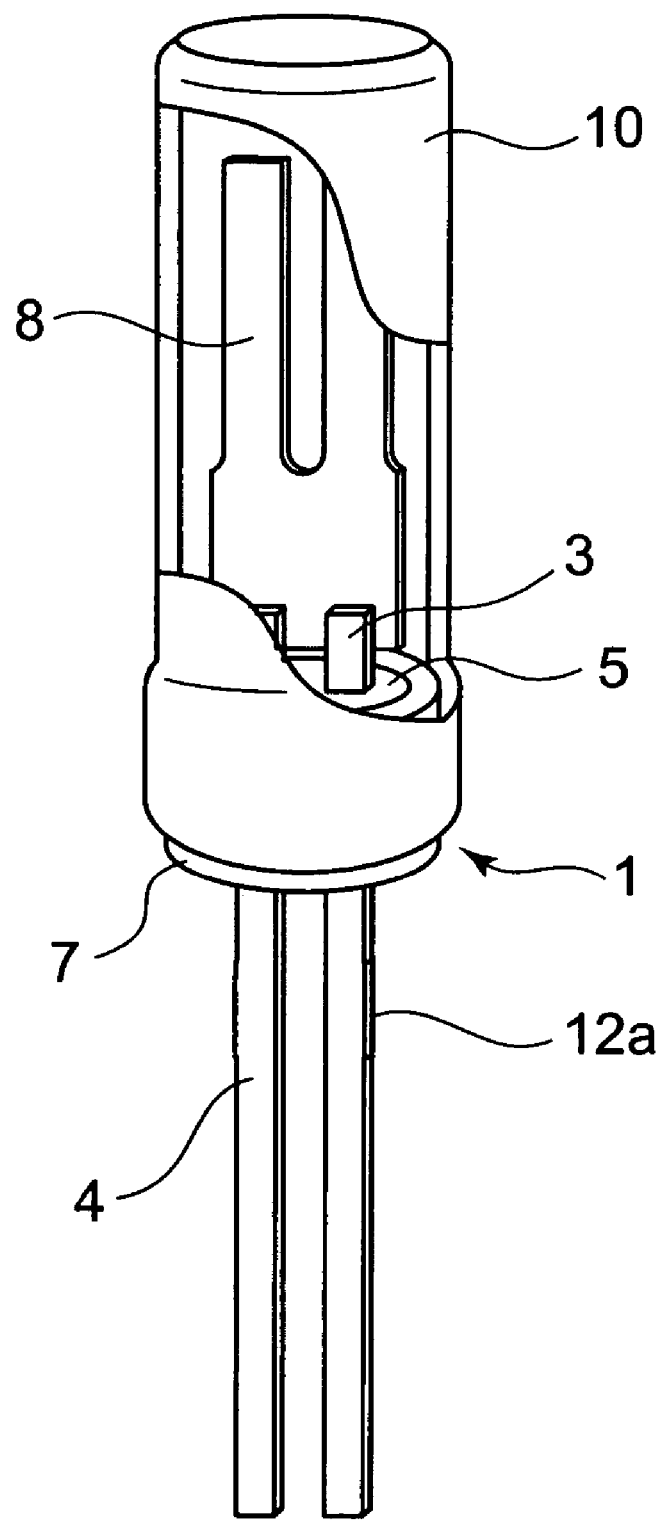
FIG. 8 is a perspective view showing an example of the construction of a cylinder type package piezoelectric vibrator according to the present invention.

FIG. 8 is a perspective view showing the construction of a cylinder type package piezoelectric vibrator produced by the production method described above, according to the present invention. In the piezoelectric vibrator shown in FIG. 8, a vibrating piece 8 is bonded to an inner lead 3 of an airtight terminal 1 by means of a metal film 16 (not shown) on the inner lead 3 and a conductive adhesive. A case 10 is press fit to and bonded to the outer peripheral surface of a stem 7 of the airtight terminal 1 by means of close fitting and the elasticity of the metal film 16 formed on the outer peripheral surface of the stem provides airtight sealing. An excitation electrode (not shown) formed on the surface of the vibrating piece 8 is connected to the inner lead 3 and to the outer lead 4. The excitation electrode serves as a vibrator through a required electrical connection to the outer lead 4. A metal film (not shown) is formed on the surface of the outer lead 4 to provide sufficient wetting property to solders on a mounting substrate and the like.

Piezoelectric vibrators are assembled in the piezoelectric vibrator assembly process, which prevents contact between airtight terminals. Therefore, oscillation instability due to fine metal particles adhered to the vibrating piece 8 resulting from plating film peeling and failures such as oscillation stop are sufficiently controlled, thus contributing greatly to quality improvements. In a sealing step for cases 10, degassing work is also done at a high temperature for a sufficiently long time. For an airtight sealed space, a vacuum can be maintained for a long period of time. Therefore, the piezoelectric vibrators can be kept highly accurate because fluctuations in resonance frequency and resonant resistance values are controlled.

Second Embodiment

A second embodiment of present invention will be described in detail with reference to the drawings. The second embodiment is a production method where airtight terminals are arranged and held on the same lead frame and are caused to flow consistently during an airtight terminal production process, a piezoelectric vibrator assembly process and a resin shaping process. A resin molded package having a built-in cylinder type package piezoelectric vibrator is taken for an example of the production method. The [piezoelectric vibrating piece production process] in the second embodiment is the same as that in the first embodiment described above and will not described below. The [piezoelectric vibrator assembly process] in the second embodiment is basically the same as the piezoelectric vibrator assembly process described above in the first embodiment and only different points will be described below. The piezoelectric vibrator assembly process in the second embodiment is different from that in the first embodiment in that an external electrode terminal and a dummy terminal, both for use in the resin shaping process, are disposed on a contour formation portion in advance in the contour formation step of the airtight terminal production process.

[Airtight Terminal Production Process]

Figure 9:
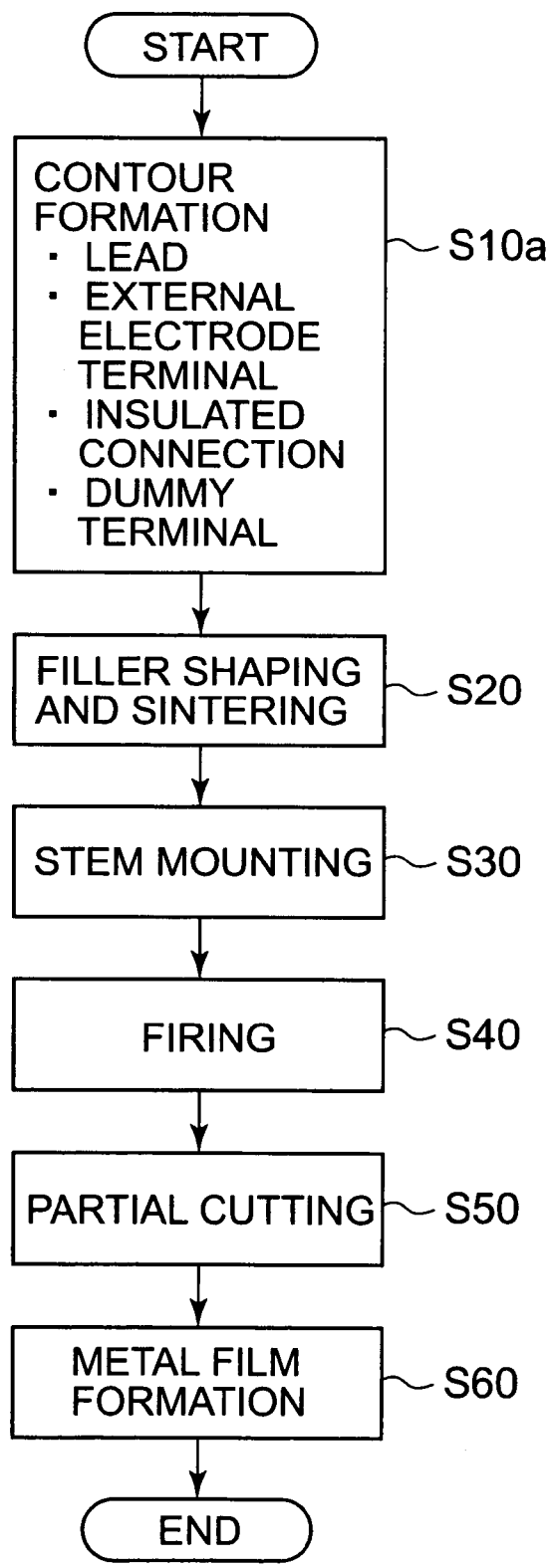
FIG. 9 is a schematic flow chart showing an example of the airtight terminal production process according to the second embodiment of the present invention.

FIG. 9 is a schematic flow chart showing the airtight terminal production process in the second embodiment according to the present invention. According to the flow chart, airtight terminals are produced as described below. A contour formation step of selecting a plate- or strip-shaped conductive material for the lead frame, disposing a contour formation portion a lead for the airtight terminal and a base adjacent to the contour formation portion on the lead frame, arranging a plurality of contours of the lead on the contour formation portion at predetermined intervals, forming a contour of an external electrode terminal so that the contour branches off from each of the plurality of contours of the lead, is disposed to be parallel to the lead, and extend and is connected to the base, forming a contour of the insulated connection with one end thereof connected to the base so that the contour of the insulated connection faces each of the plurality of contours of the lead, and forming a dummy terminal connected to the base on the contour formation portion so that the dummy terminal faces the external electrode terminal is performed (step 10).

A filler shaping and sintering step of filling the lead having the contours thereof formed with the filler in a predetermined position and shaping the filler, filling the lead with the filler and shaping the fill to connect the one end of the lead to a non-base side of the insulated connection having the contours thereof formed, and sintering the two fillers shaped is then performed (step 20).

A stem mounting step of mounting a stem on a circumference of the fillers sintered, which filler sintered is located on the lead, (step 30) is then performed.

A firing step (step 40) of heating, melting and cooling the filler in the stem and the filler at the insulated connection is then performed.

A partial cutting step (step 50) of separating one end of the lead from a connection region and base of an inner lead cutting off a portion connected to the base of the lead by means of cutting is further performed.

Finally, a metal film formation step (step 60) of forming a metal film on the surfaces of the above lead, stem, external electrode terminal, and dummy terminal is performed.

Figure 10:
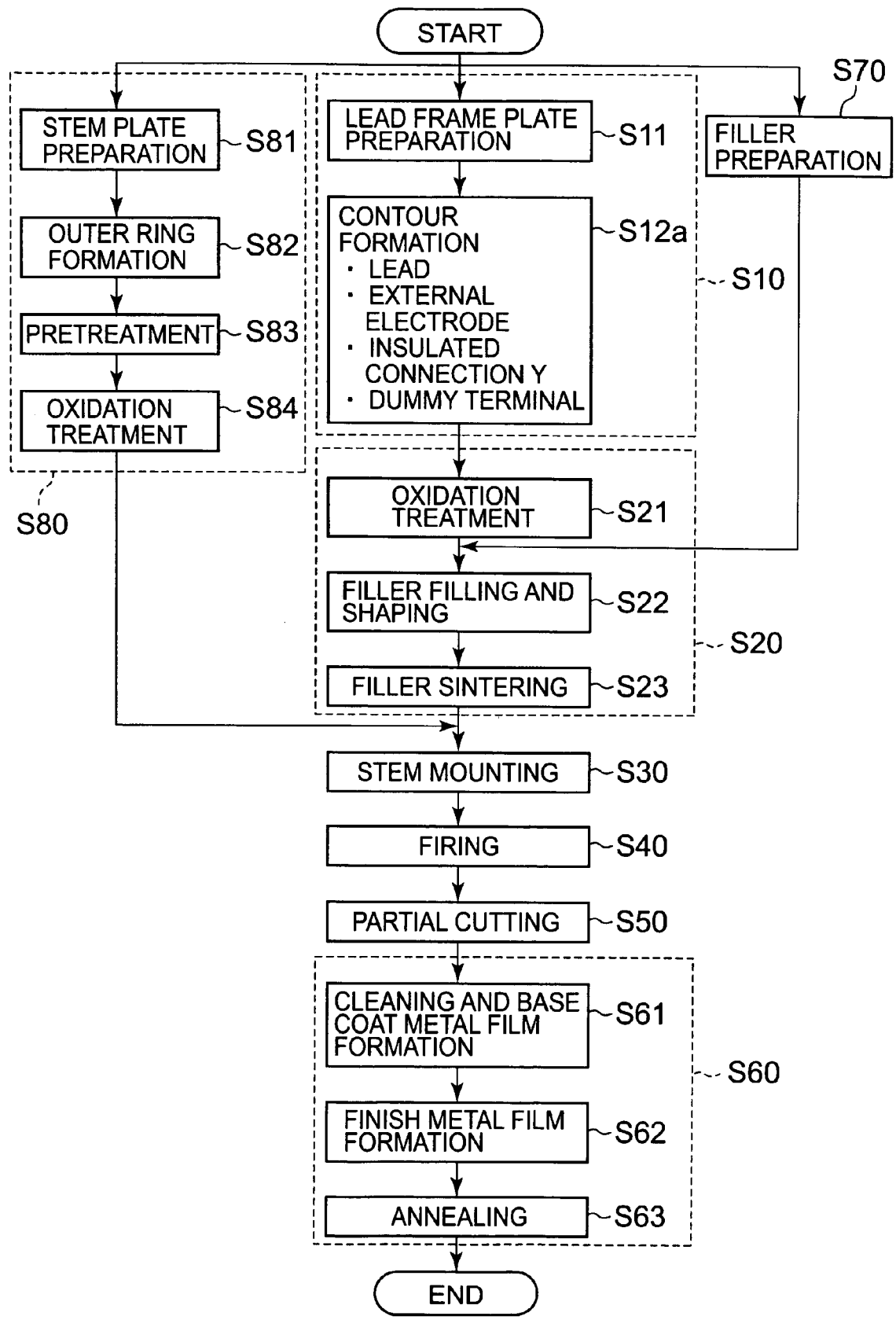
FIG. 10 is a detailed flow chart showing an example of airtight terminal production according to the second embodiment of the present invention.
Figure 11A:
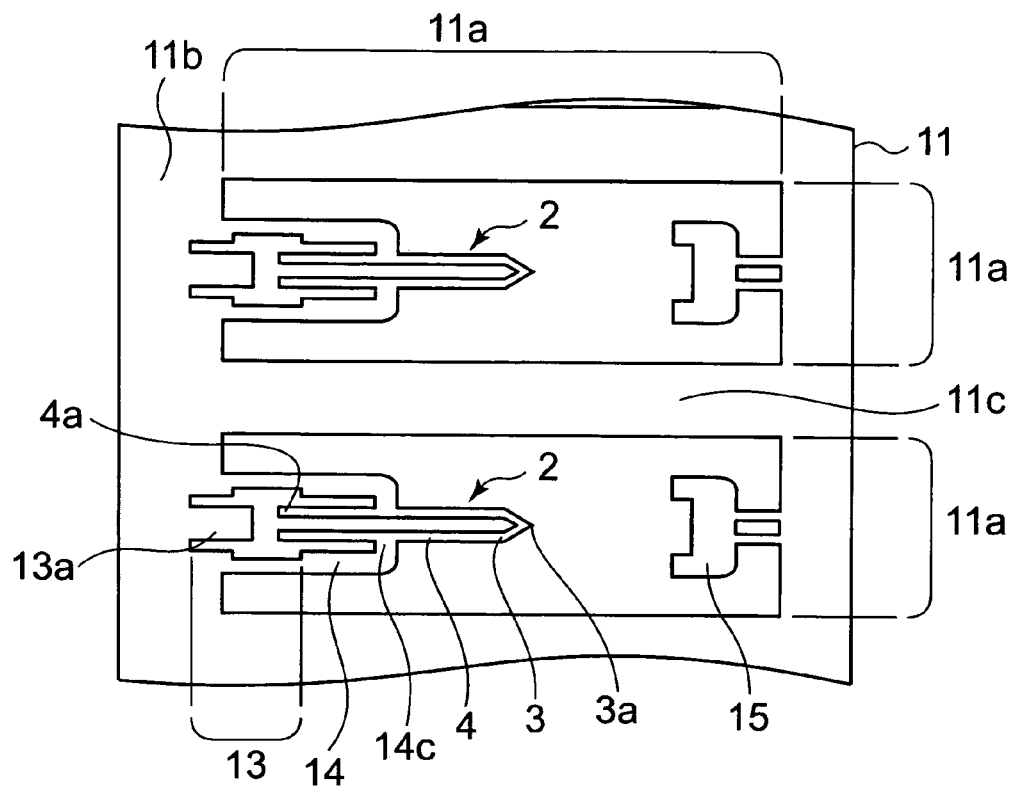
FIG. 11A is an explanatory diagram for a contour formation step in the airtight terminal production process according to the second embodiment of the present invention.
Figure 11B:
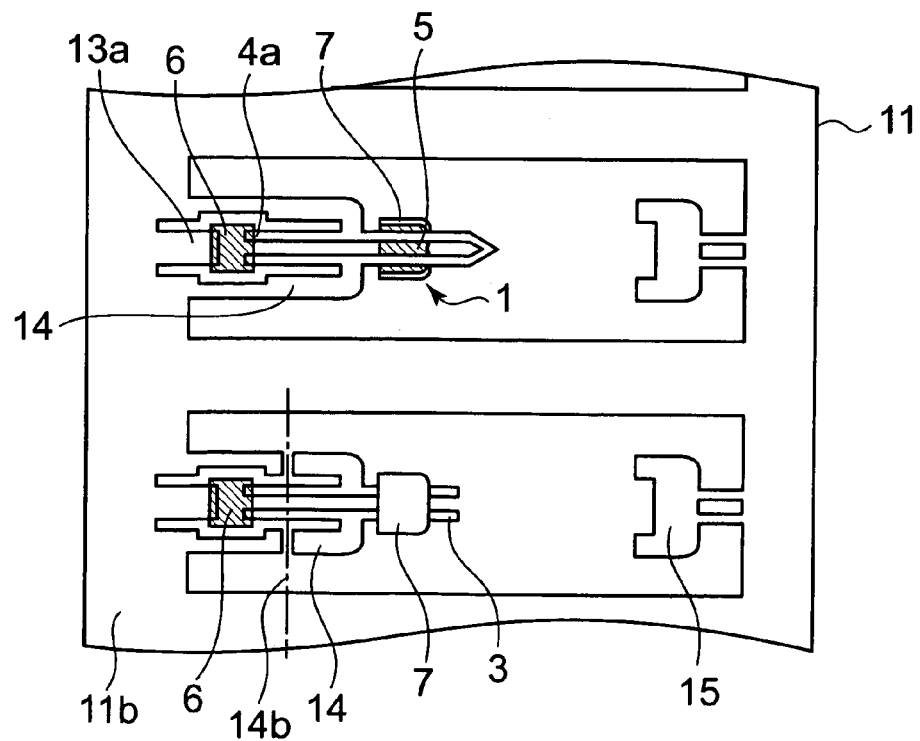
FIG. 11B is an explanatory diagram for a filler shaping and sintering step, a stem mounting step, and a partial cutting step in the airtight terminal production process according to the second embodiment of the present invention.
Figure 12A:
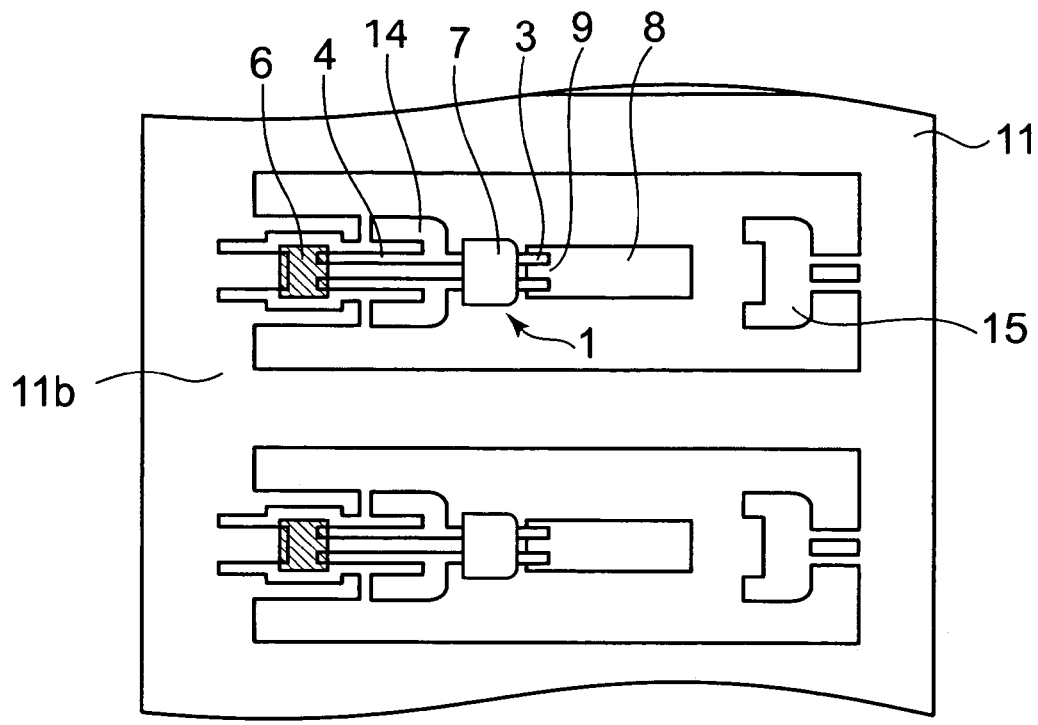
FIG. 12A is a diagram showing the state of piezoelectric vibrators after a vibrating piece mounting step in a piezoelectric vibrator assembly process according to the second embodiment of the present invention.
Figure 12B:
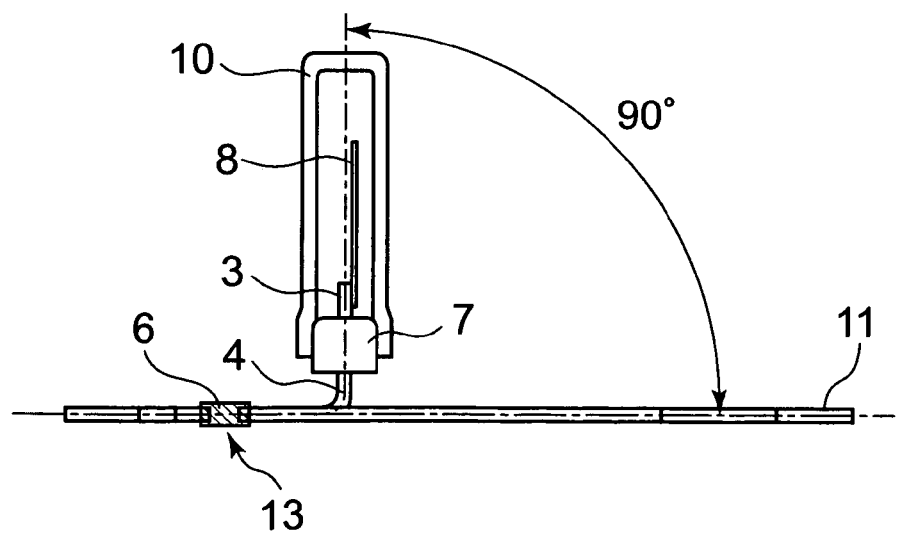
FIG. 12B is a diagram showing the state of piezoelectric vibrators after a capping step in the piezoelectric vibrator assembly process according to the second embodiment of the present invention.

The airtight terminal production process classified into the six steps described above will be described in detail with reference to FIGS. 10 to 12. FIG. 10 is a flow chart showing substeps of the steps of the airtight terminal production process shown in FIG. 9. FIG. 11A is an explanatory diagram for the contour formation step in the airtight terminal production process. FIG. 11B is an explanatory diagram for the filler shaping and sintering step, the stem mounting step, and the partial cutting step in the airtight terminal production process. FIG. 12A is a diagram showing the state of the piezoelectric vibrators after the vibrating piece mounting step in the piezoelectric vibrator assembly process. FIG. 12B is a diagram showing the state of the piezoelectric vibrators after the capping step in the piezoelectric vibrator assembly process.

For a conductive material which the airtight terminal is made of, as in the first embodiment, a plate material such as low carbon steel (Fe), alloy of ion and nickel (Fe—Ni), an alloy of ion, nickel, and cobalt (Fe—Ni—Co) is used. The plate material may be plate- or strip-shaped or hoop-shaped.

1) Contour Formation Step (Step 10)

In a contour formation step (step 10), a plate material (hereinafter referred to as a lead frame as in the first embodiment, and depicted by a reference numeral 11) is first prepared, which material is one of the materials described above and has an appropriate width (step 11). A plurality of contour formation portions 11a and a base 11b adjacent to the contour formation portions 11a are disposed in predetermined positions on the lead frame 11. Four types of contours are formed on the contour formation portion 11a: a lead 2, an insulated connection 13, an external electrode terminal 14, and a dummy terminal 15. Each above four type s of contours form one set. Each set of contours of four types serves as a important region for components for forming a piezoelectric vibrators or flowing.

Each of the four types of contours is formed on the contour formation portion 11a by means of mechanical operations such a press work, laser processing, or chemical operations such as etching. This step will be described below with reference to FIG. 11A.

In the second embodiment, the contours of a lead 2 are formed to be connected to a base 11b of a lead frame 11 through an external electrode terminal 14. In other words, the lead 2 is connected to the base 11b at a region that branches off from the side thereof and is extended to the base 11b. The region extended is formed to serve as an external electrode terminal 14. More specifically, as shown in FIG. 11A, the branching region is provided, which branches off from the right and left sides of the lead 2. The region is arranged to be parallel to the lead 2. The region is formed to be extended and connected to the base 11b side so the region serves as external electrode terminal 14. The region is referred to as a connection portion in the lead 2 shown in the first embodiment. The connection portion ends the role thereof when a filler 6 on an insulated connection 13 is fired and a mechanical strength is met. The connection portion is then separated from the side from where the portion branches off in the partial cutting step (step 50). In the lead 2 in the second embodiment, however, the region plays the same role until the filler 6 on an insulated connection 13 is fired and a mechanical strength is met. After this point, the region is handled a different way from the connection portion. In the lead 2 in the second embodiment, one end of the region is separated from the base 11b by means of cutting so that the region has a predetermined length, in the partial cutting step (step 50). In the resin shaping process, the region is bent so that the region is shaped like a crank. The region is design with predetermined dimensions and a predetermined shape and disposed to serve as an external electrode terminal 14.

A technique for forming the insulated connection 13 is the same as with the first embodiment, but will described below again. Namely, of two thin bars formed at the contour formation portion 11a of the lead, the end of one bar is connected to the connection region 3a of the inner lead 3 and the end of the opposite outer-lead-side bar serves as an open end. A region protruding from the base 11b side to the contour formation portion 11a is formed in a position opposite to the open end 4a of the opposite outer-lead-side bar. The region is referred to as a protruding portion 13a. The open end 4a of the outer lead of the lead 2 and the protruding portion 13a together are referred to as an insulated connection, depicted by a reference numeral 13 in the second embodiment according to the present invention as in the first embodiment.

The insulated connection 13 is filled with a filler 6 in the next step so as to ensure electrical insulating properties and to connect the open end 4a of the outer lead and protruding portion 13a to each other. The filler 6 is fired at the step 40 and the protruding portion 13a and the open end 4a of the outer lead are connected to each other in a mechanically safe manner.

The dummy terminal 15 is formed on the contour formation portion 11a with one end connected to the base 11b so that the dummy terminal faces the external electrode terminal 14 described above. The dummy terminal 15 and the base 11b are connected to each other using two narrow members, considering that the two members are cut off at the last step (step 450 in FIG. 13) of the resin shaping process. This provide rigidity relative to torsion and good cuttability.

Sets of contours of four types are formed at predetermined intervals on the contour formation portion 11a.

After the partial cutting step (step 50), the lead 2 is mechanically held to the base 11b by means of only the insulated connection 13. In this way, the lead 2 is electrically insulated from and mechanically connected to the base 11b. In the piezoelectric vibrator assembly process, a resonance frequency measurement step and a sorting step can therefore be performed without any electrical interference between adjacent piezoelectric vibrators.

In the second embodiment, leads are formed so that the ends of every pair of inner lead 3 are connected to each other. Forming each lead 2 in this way allows two leads to share a load imposed on the lead 2 during the airtight terminal production process, thus making leads difficult to bend. It is therefore possible to prevent a reduction in parallelism for each pair of two leads. It is also possible to partially change the width of the inner lead 3.

In addition, the lead 2 is provided with a convex filler positioning portion for positioning a filler 5, which will be charged into the lead in a predetermined position and shaped in a subsequent step (not shown).

In FIG. 11A, the outer lead 4 is also shown to have the same width as the inner lead 3. The width of the outer lead 4 may be also larger than the width of the inner lead 3, which provide the lead 2 rigidity, thus making it possible to prevent the outer lead 4 from bending during the airtight terminal production process.

Note that in FIG. 11A, a section bar, depicted by a reference numeral 11c in the base 11b, is shown to separate one airtight terminal from another. However, the section bar 11c can be provided to separate a group of more than one airtight terminal from another, allowing for rigidity relative to a torsion in the lead frame 11.

2) Filler Shaping and Sintering Step (Step 20)

The next step is a filler shaping and sintering step (step 20). The details of the step are the same as that in the first embodiment and will not described below.

3) Stem Mounting Step (Step 30)

The next step is a stem mounting step (step 30). The airtight terminal on top shown in FIG. 11B is shown to be through with the step. The details of the step are the same as that in the first embodiment and will not described below.

4) Firing Step (Step 40)

The next step is a firing step (step 40). The details of the step are the same as that in the first embodiment and will not described below.

5) Partial Cutting Step (Step 50)

The next step is a partial cutting step (step 50). This step will be described below with reference to FIG. 11B in terms of the airtight terminal 1 at the bottom. There are two cutting points. One cutting point is at the connection region 3a of the inner lead. In this cutting step, one of the pair of two inner leads 3 is separated from the other. The airtight terminal 1 shown in FIG. 11B is shown to have one portion of the connection region 3a of the inner lead 3 separated from the other. The other cutting point is at one end of the external electrode terminal 14, which branches off from the lead 2 and is connected to the base 11b. The external electrode terminal 14 is cut off so as to have a predetermined length because the external electrode terminal 14 is bent so that the external electrode terminal 14 is shaped like a crank in the resin shaping process and appears at the bottom of a resin package. A cutting line depicted by a reference numeral 14b passing through the external electrode terminal represents a line along which cutting is done. This separates one of the two leads 2 of the airtight terminal 1 from the other electrically and completely and the lead is mechanically connected to the base 11b of the lead frame 11 by means of only the insulated connection 13.

Note that in this embodiment the partial cutting step is performed before a metal film formation step for the purpose of forming a metal film on the cut surface of the external electrode terminal 14 of the inner lead 3 as well. In any application where no metal films need to be formed, the partial cutting step can be performed after metal film formation. Note that the external electrode terminal 14 of the inner lead 3 can be cut off not only for cutting purposes but also to provide the inner lead 3 a variety of shapes at the same time.

6) Metal Film Formation Step (60)

A metal film is then formed on the lead 2, stem 7, external electrode terminal 14, and dummy terminal 15 (step 60). An example of a case where metal films of the same material are applied by means of a wet plating method will be described below. The lead frames 11 are entirely cleaned first (step 61). The lead frames 11 are arranged and immersed in a plating bath to apply base coat plating to each of the lead 2, stem 7, external electrode terminal 14, and dummy terminal 15 on electroplating conditions appropriately selected. Each of the lead 2, stem 7, external electrode terminal 14, and dummy terminal 15 is plated with one of Cu, Ni and the like selected for a coat plating material to a thickness of approximately 2 to 5 μm or so. For finish plating, a plating material and a method are then selected from a single material such as tin (Sn) and silver (Ag), an alloy of tin and lead (Sn—Pb), an alloy of tin and bismuth (Sn—Bi), an alloy of tin and antimony (Sn—Sb), an alloy of tin and copper (Sn—Cu), and plating of an alloy of tin and copper followed by Ag plating. The lead 2 and stem 7 are then plated with any selected one of the above materials to a thickness of approximately 8 to 15 μm (step 62).

In the metal film formation step, airtight terminals are arranged at constant intervals at the base 11b of the lead frame 11. It is therefore possible to fully control the occurrence of pairs of two leads connected together through plating and contact of one lead 2 with another due to a reduction in airtight terminal size. This therefore makes it possible to solve the problem of a great drop in yield found in a related-art barrel plating step. Even if there is a further reduction in size of the airtight terminal 1, the method according to the present invention makes it possible to control a drop in yield in a plating step. After the end of plating, the plating film is stabilized by means of annealing (step 63).

In the above metal film formation step, a method for forming a metal film by means of wet plating has been take as an example of a metal film formation method. However, the method of forming a metal film is not limited to only wet plating. For example, various film formation methods such as vapor-phase growth, vapor deposition, sputtering, and ion plating can also be utilized.

Through the steps described above, airtight terminals 1 are arranged at constant intervals on the lead frame 11s and the external electrode terminal 14 and dummy terminal 15 corresponding to each airtight terminal 1 are formed. The individual airtight terminals are connected to the base 11b of the lead frame 11 through the insulated connection 13 and electrically insulated from the circumference thereof. With these airtight terminals in the state described above, the airtight terminals are ready to go to the next process, i.e., the piezoelectric vibrator assembly process. These airtight terminals can be caused to flow consistently with the airtight terminals on the same lead frame 11 during the airtight terminal production process and the piezoelectric vibrator assembly process. In addition, airtight terminals are composed of metal and glass only. Even when these airtight terminals are heated to a temperature above 200° C. in the baking step, the sealing step and the like of the piezoelectric vibrator assembly process, gases leaving the airtight terminals raise no problem. It is therefore possible to control a quality problem caused by gases from airtight terminals in an airtight space, which is more and more conspicuous with smaller piezoelectric vibrators, that is, fluctuation in resonance frequency and resonant resistance values for piezoelectric vibrators.

A piezoelectric vibrator assembly process where the airtight terminals produced by means of the production method described above are used as with piezoelectric vibrators in the first embodiment will be described below.

[Piezoelectric Vibrator Assembly Process]

The piezoelectric vibrator assembly process in the second embodiment is different from the piezoelectric vibrator assembly process in the first embodiment in that piezoelectric vibrators connected to the lead frame 11 is sent to the next resin shaping process without performing the last step 370 of the piezoelectric vibrator assembly process. The details of the piezoelectric vibrator assembly process expect the difference is the same as in the first embodiment and will not be described below. A difference between two embodiments will be described briefly with reference to FIGS. 12A and 12B.

As described above, FIG. 12A is a diagram showing the state of the piezoelectric vibrators after the vibrating piece mounting step in the piezoelectric vibrator assembly process. FIG. 12B is a diagram showing the state of the piezoelectric vibrators after the capping step in the piezoelectric vibrator assembly process. FIG. 12A corresponds to FIG. 7A showing the first embodiment while FIG. 12B corresponds to FIG. 7B showing the first embodiment. Each component depicted by the same reference numerals as used in FIG. 7A has the same designation and the same function. In other words, airtight terminal 1, inner lead 3, outer lead 4, filler 6 of insulated connection, stem 7, vibrating piece 8, mount pad 9, lead frame 11, and base 11b of the lead frame are formed and configured as in the first embodiment and have the same function.

Components added to the arrangement include an external electrode terminal 14, which is formed to branch off from the outer lead 4. A dummy terminal 15 is formed integratedly in a contour formation portion 11a of a lead frame 11 as a component added so that the dummy terminal 15 protrudes from the base 11b, which is at a position opposite to the base 11b of the outer lead 4 sides with a vibrating piece 8 located therebetween.

The resin shaping process will be described below with reference to FIGS. 13 and 14.

[Resin Shaping Process]

Figure 13:
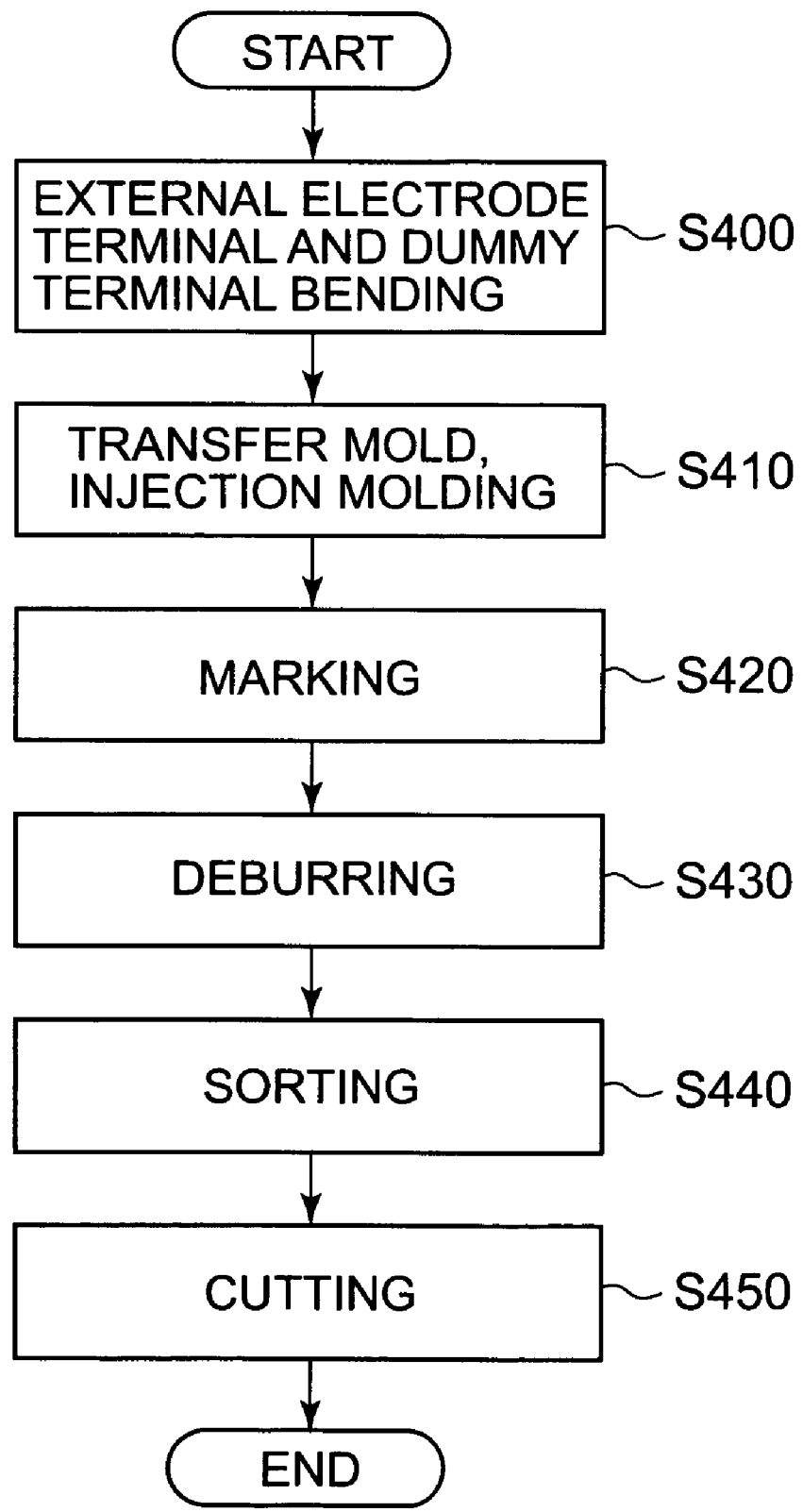
FIG. 13 is a production flow chart showing an example of a resin shaping process according to the present invention.

FIG. 13 is a production flow chart showing a resin shaping process. In the resin shaping process shown in FIG. 13, a new lead frame for mold step only need not be prepared, which is conventionally required. The same lead frame that has passed through the preceding piezoelectric vibrator assembly process can be caused to flow during the resin shaping process. In this way, the airtight terminals can be caused to flow consistently with the airtight terminals on the same lead frame 11 during three processes, i.e., the airtight terminal production process, the piezoelectric vibrator assembly process, and the resin shaping process.

Figure 14A:
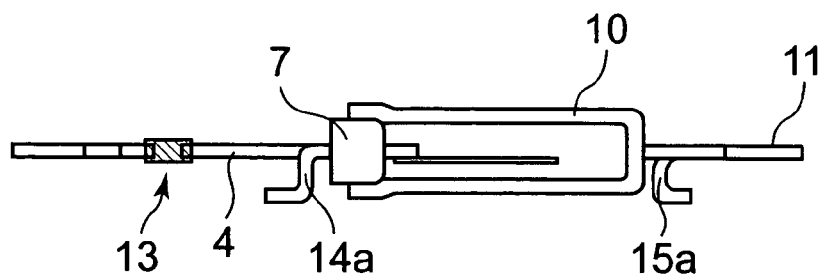
FIG. 14A is a side view of a piezoelectric vibrator through with the bending of an external electrode terminal and a dummy terminal in a resin shaping process for a piezoelectric vibrator, according to the second embodiment of the present invention.
Figure 14B:
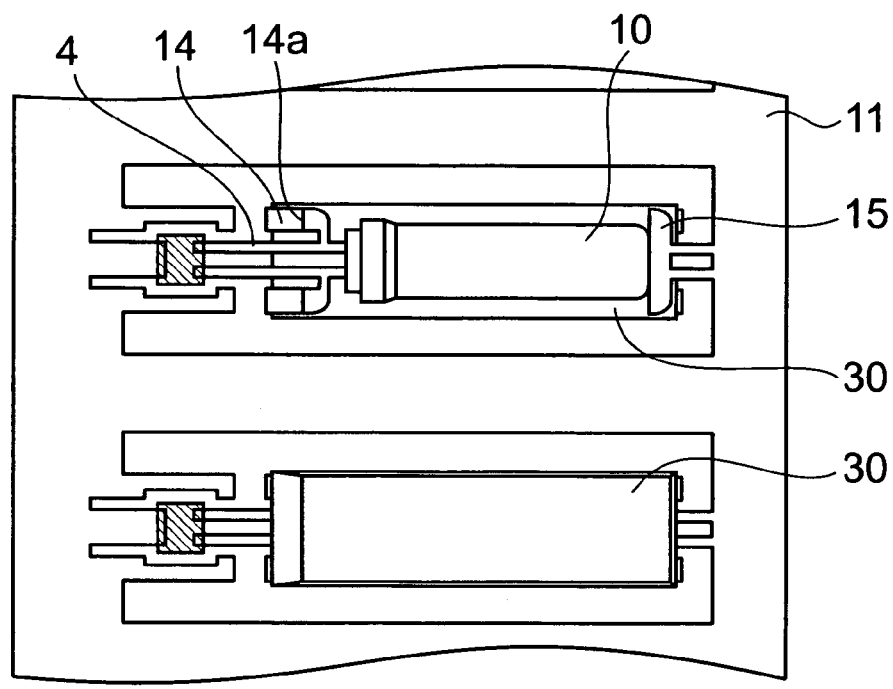
FIG. 14B is a plan view showing the appearance and inside of a piezoelectric vibrator after resin mold.
Figure 14C:
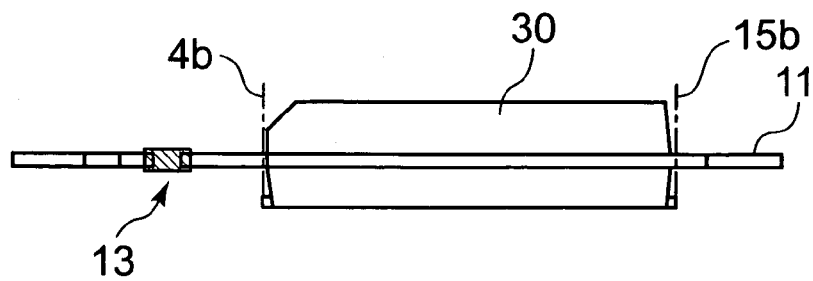
FIG. 14C is a side view showing the appearance of a piezoelectric vibrator in a cutting step after resin mold.

FIG. 14A is a side view of a piezoelectric vibrator through with the bending of an external electrode terminal and a dummy terminal in a resin shaping process. FIG. 14B is a plan view showing the appearance and inside of a piezoelectric vibrator after resin mold. FIG. 14C is a side view showing the appearance of a piezoelectric vibrator in a cutting step after resin mold.

Bending work is first performed on an external electrode terminal 14 and a dummy terminal 15 (step 400). The external electrode terminal 14 is bent so that the external electrode terminal 14 is shaped like a crank, as is shown in FIG. 14A, to form a bent portion 14a so that a horizontal surface at the end appears at the bottom. An opposing dummy terminal 15 is bent to be shaped like a horseshoe so that the end appears at the bottom through a rise portion 15a.

The second embodiment provides effects described below. In a related-art process, the following steps are required before a resin mold step: (1) a package supply step of supplying cylinder type packages, (2) an outer lead shaping step of transferring the cylinder type packages, widening the outer lead 4 to obtain a predetermined shape, and cutting off an extra length portion from the outer lead 4, (3) a package positioning step of transferring the cylinder type packages with an extra portion cut off from the outer lead 4 to a lead frame 31, and positioning each of the cylinder type packages on the lead frame 31, (4) a welding step of welding the outer lead 4 of each of the positioned cylinder type packages to a connection region of an external electrode terminal pre-formed on the lead frame 31, and (5) a weld inspection step of monitoring welds on a screen and determining whether each of the welds is acceptable or not. These steps have problems described below. In the above-mentioned step (3), it is necessary to control a horizontal shift with a positioning jig for a cylinder type package considering the curve of the cylinder type package when aligning the lead frame 31 with the package. In the step (3), there is also a break in a vibrating piece 8 due to impact resulting from impact contact between the end of the case of the cylinder type package and the rise portion 35a of the dummy terminal 35 when transferring the cylinder type package as well as a fail of the cylinder type package off a loading jig. In the welding step (4), a clearance between a bottom electrode for welding and a welding region 33 of the external electrode terminal 34 pre-formed on the lead frame 31 makes it for welding current to flow which can easily cause welding failures. In addition, the welded electrode portion requires a periodical maintenance.

The second embodiment makes it possible to omit all of the five step described above, i.e., (1) a package supply step, (2) an outer lead shaping step, a package positioning step, (4) a welding step, and (5) a weld inspection step. This contributes greatly to improvement in product reliability and reduction in lead time.

After the steps described above, resin shaping is performed. The cylinder type package is held between a top die and a bottom die, neither of which is shown, and a thermosetting molding material such as epoxy resin is poured in a space between the molds for resin shaping by means of a transfer mold. Alternatively, a cylinder type package piezoelectric vibrator is molded from a thermoplastic molding material such as liquid crystal polymer resin by means of injection mold (step 410). The interior of the piezoelectric vibrator on top-shown in FIG. 14B is shown on the assumption that the resin 30 is transparent. The appearance of the piezoelectric vibrator at the bottom is shown, which is molded out of resin 30. A comparison between the piezoelectric vibrator on top and the piezoelectric vibrator at the bottom indicates the positional relation between the piezoelectric vibrator, external electrode terminal 14, and dummy terminal 15 in the interior of a cylinder type package piezoelectric vibrator molded of resin 30.

The next step is a marking step. Marking is performed on the surface of the cylinder type package piezoelectric vibrator molded of resin by means of printing, a laser, and the like. Prints are cured as required for stabilization purposes (step 420). Burrs resulting from a transfer mold step and an injection mold step (step 410) are removed using water and a chemical (step 430). Electrical properties such as resonance frequency and resonant resistance values for vibrators are measured for each lead frame to classify frequencies by a predetermined width (step 440). Electrical properties are measured through simultaneous probing on the external terminal portions of a plurality of piezoelectric vibrators because the piezoelectric vibrators are connected to the base 11b of the lead frame 11 through the insulated connection 13.

The next step is a step for cutting off packages molded (step 450). In this step, outer leads 4 are separated from the insulated connection 13 by means of cutting and, dummy terminals 15 are cut off from the base 11b as well. A cutting line is indicated by an alternate long and short dash line in FIG. 14C. The outer leads 4 and the dummy terminals 15 are cut off at a point depicted by a reference numeral 4b and at a point depicted by a reference numeral 15b, respectively. This completely separates the piezoelectric vibrators from the lead frame 11, which are handled as piezoelectric vibrators completed.

Figure 15A:
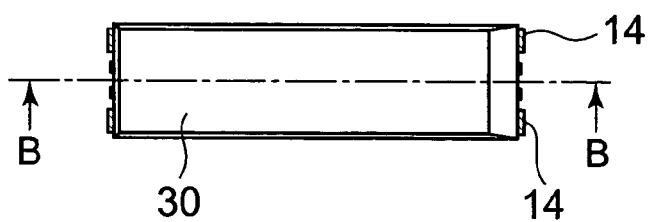
FIG. 15A is a plan view of an example of a resin molded package according to the present invention.
Figure 15B:
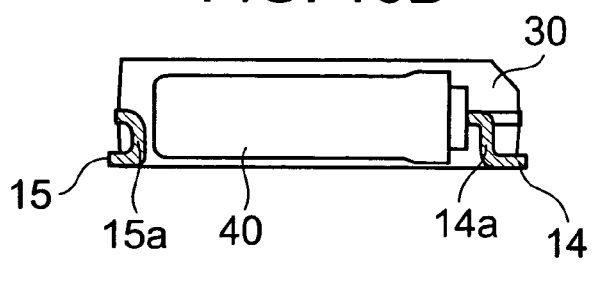
FIG. 15B is a cross sectional view of the resin molded package of FIG. 15A, taken along a line B-B.
Figure 15D:
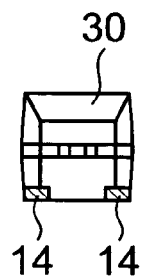
FIG. 15D is a right side view of the resin molded package of FIG. 15A.
Figure 15C:
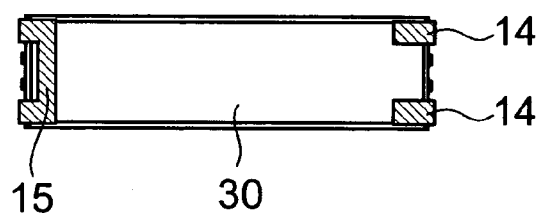
FIG. 15C is a bottom view of the resin molded package of FIG. 15A.

FIG. 15A is a plan view of a piezoelectric vibrator for a resin molded package according to the present invention. FIG. 15B is a cross sectional view of the piezoelectric vibrator of FIG. 15A, taken along a line B-B. FIG. 15C is a bottom view of the piezoelectric vibrator of FIG. 15A. FIG. 15D is a right side view of the piezoelectric vibrator of FIG. 15A. In the piezoelectric vibrators shown in FIGS. 15A, 15B, and 15C, the right-hand terminal of the piezoelectric vibrator is an external electrode terminal and the left-hand terminal is a dummy terminal. The direction of terminals in FIGS. 15A, 15B, and 15C are opposite to the direction of terminals of the airtight terminal or piezoelectric vibrator shown in FIG. 12 and FIGS. 14A to 14C.

As shown in FIG. 15B, the cylinder type package piezoelectric vibrator 40 is molded out resin 30 such as epoxy resin and liquid-crystal polymer. The external electrode terminal 14 extended from outer lead 4 of the airtight terminal 1 have a crook 14a shaped like a crank and appears at the bottom of a resin package in a mold. A dummy terminal 15 connected to an electrode film on a vibrating piece 8 is provided at an end opposite to the external electrode terminal 14 and the dummy terminal 15 is paired with the external electrode terminal 14 to serves as an external electrode for mounting. In other words, each of the external electrode terminal 14 and the dummy terminal 15 has a metal film 16, not shown, formed on the surfaces thereof to have sufficient wetting property relative to solders on a substrate. Unlike a piezoelectric vibrator of a related-art resin molded package, the piezoelectric vibrator of a resin molded package according to the second embodiment has the external electrode terminal 14 formed to branch off from the outer lead 4 of the airtight terminal 1, with no welding points on any portion of the external electrode terminal 14. The piezoelectric vibrator of a resin molded package according to the second embodiment therefore does not suffer from a failure such as insufficient welding strength— which can easily result during the welding step, thus providing stable quality. The encased piezoelectric vibrator is through with degassing at a sufficiently high temperature during piezoelectric vibrator assembly process and maintain a high degree of vacuum over a long period of time. Therefore, in the piezoelectric vibrator for a resin molded package, fluctuations in resonance frequency and resonant resistance values are controlled over a long period of time, thus allowing the piezoelectric vibrator to be kept high accurate.

Third Embodiment

Figure 16:
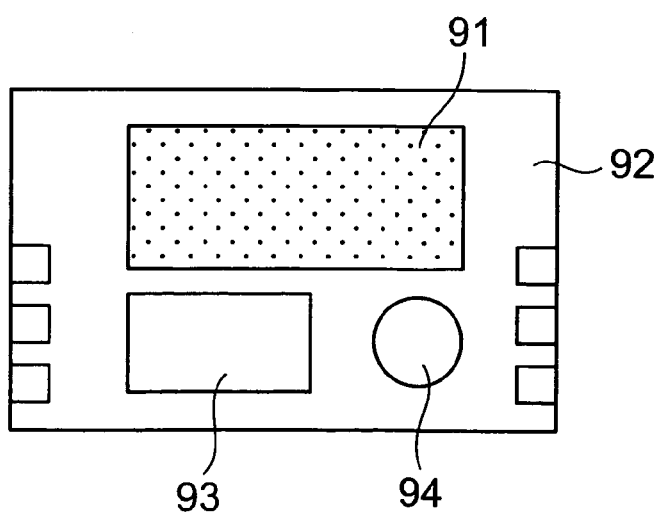
FIG. 16 is a schematic pattern diagram showing an example of the configuration of a tuning fork type quartz crystal oscillator according to the present invention.

A third embodiment of present invention will be described below. FIG. 16 is a schematic pattern diagram showing the configuration of a tuning fork type quartz crystal oscillator according to the present invention and showing a surface-mounted piezoelectric oscillator connected to an integrated circuit, which utilizes the tuning fork type quartz crystal vibrator described above as an oscillator.

A tuning fork type quartz crystal vibrator 91 is set in a predetermined position on a substrate 92 and an integrated circuit for an oscillator indicated by a reference numeral 93 is provided adjacent to the quartz crystal vibrator. An electronic part 94 such as a capacitor is also mounted. These parts are electrically connected together through a wiring pattern not shown. The mechanical vibration of the vibrating piece of the tuning fork type quartz crystal vibrator 91 is converted into an electrical signal due to the piezoelectric properties of a quartz crystal and input into an integrated circuit 93. In the integrated circuit 93, signal processing is performed and a frequency signal is output. The circuit functions as an oscillator. Each of these components is molded of resin not shown. A proper selection of the integrated circuit 93 provides a function to control the operating date for a single-function oscillator, and other systems of interest and external systems and to provide a user with time and calendar information.

Using the piezoelectric vibrator produced by the method according to the present invention makes it possible to use a small vibrator for a vibrator having the largest capacity of all components of an oscillator. The piezoelectric vibrator has characteristics that are difficult to change because of the controlled fluctuation in resonance frequency and resonant resistance values therefor, thus making it possible to keep the oscillator highly accurate.

Fourth Embodiment

A fourth embodiment of the present invention will be described below. The fourth embodiment is an example of an electronic unit which using a piezoelectric vibrator produced by means of a method according to the present invention with the piezoelectric vibrator connected to a timekeeping section. As an example of an electronic unit, a preferred embodiment of a portable information unit represented by a cell phone will be will be described below in detail.

As a prerequisite, a portable information unit according to this embodiment is a developed and improved version of a timepiece produced by means of related art. The portable information unit is similar to a timepiece in appearance. The portable information unit has a liquid crystal display, instead of an hour plate, which can display current time on a screen thereof. When the portable information unit is used as a communications unit, the portable information unit is removed from the wrist. A loud speaker and a microphone each incorporated inside a band section can be used to make communications as with a cell phone produced by related art.

The portable information unit is much smaller and light-weighted than a related-art cell phone.

Figure 17:
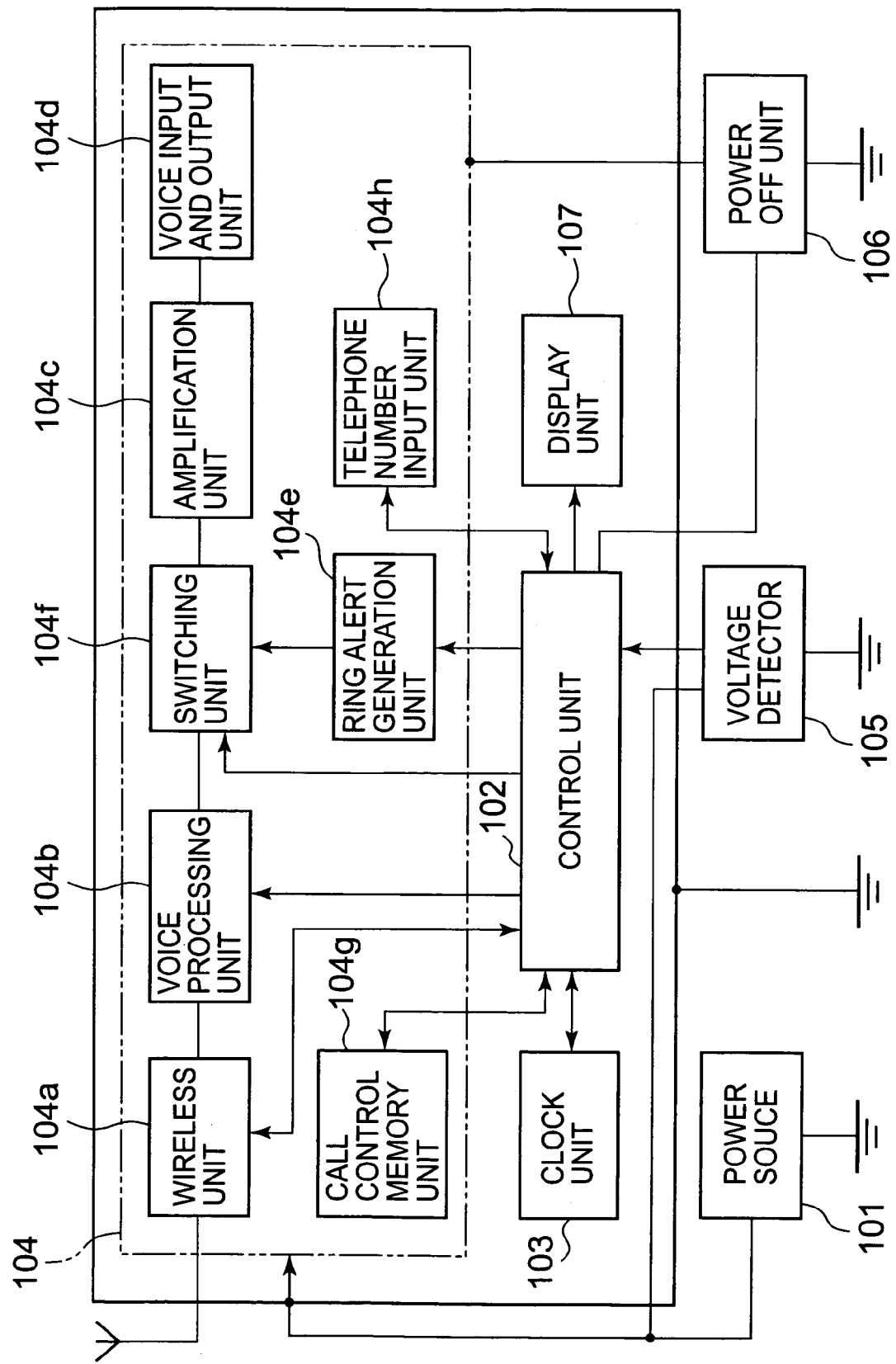
FIG. 17 is a schematic diagram showing an example of the configuration of block diagram of a portable information unit according to the present invention.

The functional configuration of the portable information unit according to the embodiment of present invention will be described below with reference to the drawings. FIG. 17 is a block diagram functionally showing the configuration of a portable information unit according to the embodiment of the present invention.

In FIG. 17, 101 denotes a power supply section which supplies electric power to each functional section, and this specifically effected by a lithium ion secondary battery. To the power supply section 101, a control section 102, a timekeeping section 103, a communication section 104, a voltage detection section 105 and a display section 107, which will be described later, are connected, and electric power is supplied from the power supply section 101 to each of the functional sections.

The control section 102 controls each of the functional sections, which will be described later, to control the operation of the entire system, such as audio data transmission and reception as well as current-time measurement and display. The control section 102 is specifically provided by a program written into ROM in advance, a CPU for reading and executing the program, and a RAM used as a work area for the CPU, and the like.

The timekeeping section 103 is composed of an integrated circuit having built there in an oscillation circuit, an register circuit, a counter circuit, and an interface circuit and a tuning fork type quartz crystal vibrator as shown in FIG. 8 or 15. The mechanical vibration of the vibrator of the tuning fork type quartz crystal vibrator is converted into an electrical signal due to the piezoelectric properties of a quartz crystal and input into the oscillation circuit formed of a transistor and a capacitor. The out of the oscillation circuit is binarized and counted by the register circuit and the counter circuit. A signal is transmitted to and received from the control section via the interface circuit and current time and current date or calendar information are displayed on the display section 107.

The communications section 104 has a similar function to a related-art cell phone. The communications section 104 is composed of a radio transmission section 104a, an audio processing section 104b, an amplification section 104c, an audio input/output section 104d, an incoming sound generation section 104e, a switching section 104f, a call control memory 104g, and a phone number input section 104h.

The radio transmission section 104a transmits to and receives various types of data from a base station via an antenna. The audio processing section 104b encodes/decodes an audio signal inputted from the radio transmission section 104a or the amplification section 104c, which will be described later. The amplification section 104c amplifies a signal inputted from the audio processing section 104b or the audio input/output section 104d, which will be described later, to a predetermined level. The audio input/output section 104d is specifically a loud speaker or microphone and makes incoming sounds and received audio audible and collects the speaker's voice.

The incoming sound generation section 104e produces an incoming sound in response to a call from a base station. The switching section 104f switches the amplification section 104c connected to the audio processing section 104b to the incoming sound generation section 104e in the present of an incoming call so that an incoming sound produced is outputted to the audio input/output section 104d via the amplification section 104c.

The call control memory 104g stores a program related to communication incoming and outgoing all control. In addition, the phone number input section 104*h* is specifically composed of number keys from 0 to 9 and some other keys and input a call receiver's phone number and the like.

The voltage detection section 105 detects a voltage drop if the voltage applied by the power supply section 101 to each of the functional sections including the control section 102 falls below a predetermined value and then notifies the control section 102. The predetermined value is a value that is preset as the minimum voltage required for the stable operation of the communications section 104 and is a voltage of 3V or so, for example. If notified of a voltage drop by the voltage detection section 105, the control section 102 prohibits the operation of the radio transmission section 104*a*, the audio processing section 104*b*, the switching section 104*f*, and the incoming sound generation section 104*e*. Particularly, the stop of the operation of the radio transmission section 104*a* with large power consumption is essential. At the same time, the display section 107 displays a message to the effect that the communications section 104 has become unavailable due to a shortage of remaining power in the battery.

The operation of the communications section 104 is prohibited via the cooperation of the voltage detection section 105 and the control section 102. A message to that effect can also be displayed by the display section 107.

In the embodiment of the present invention, the power supply section related to the function of the communications section is provided with a selectively interruptable power supply interruption section 106, thereby making it possible to stop the function of the communications section more perfectly.

A text message may be used to display a message to the effect that the communications section 104 has become unavailable. A more visceral method for marking a phone icon with X on the display section 107, for example, may be used.

Using a small piezoelectric vibrator produced by means of a method according to the present invention in a portable information unit makes it possible to further reduce the size of the portable electronic unit. The piezoelectric vibrator also has characteristics that are difficult to change because of the controlled fluctuation in resonance frequency and resonant resistance values therefor, thus making it possible to keep portable electronic units highly accurate.

Fifth Embodiment

Figure 18:
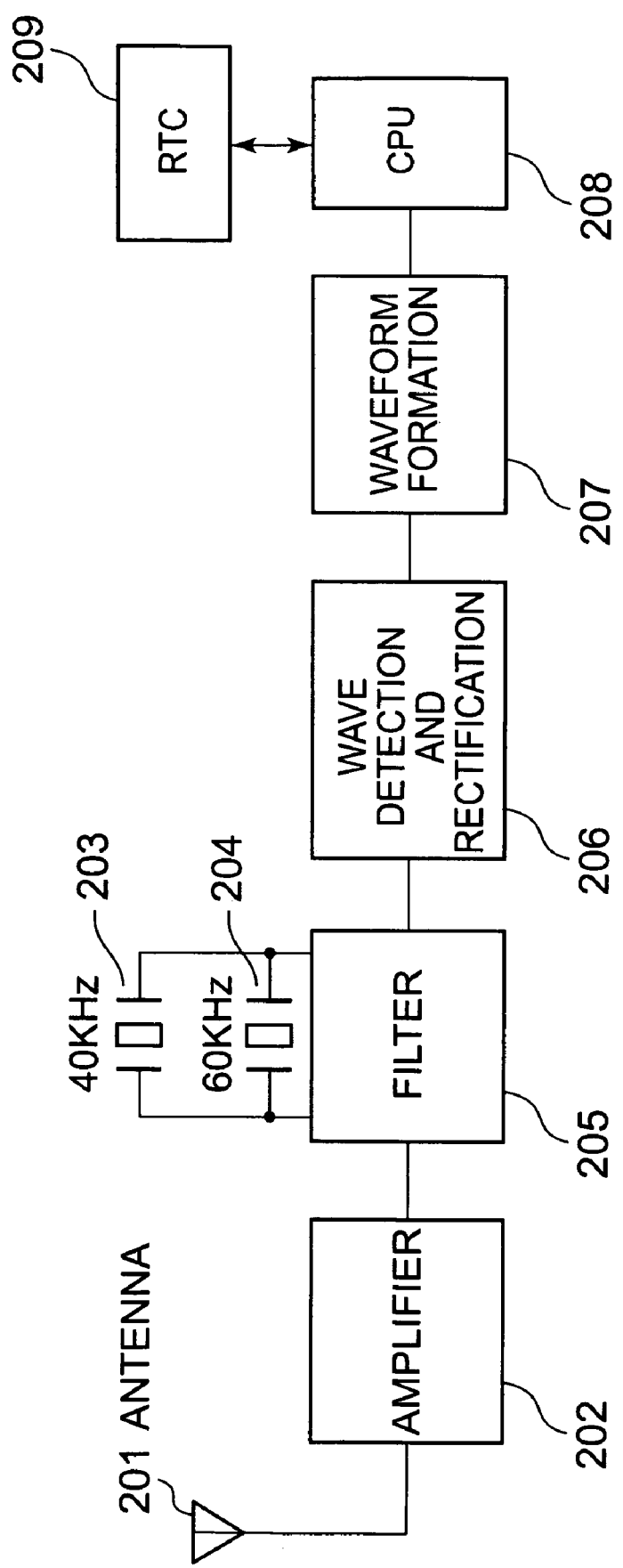
FIG. 18 is a schematic diagram showing a block diagram of a wave timepiece according to the present invention.
Figure 19A:
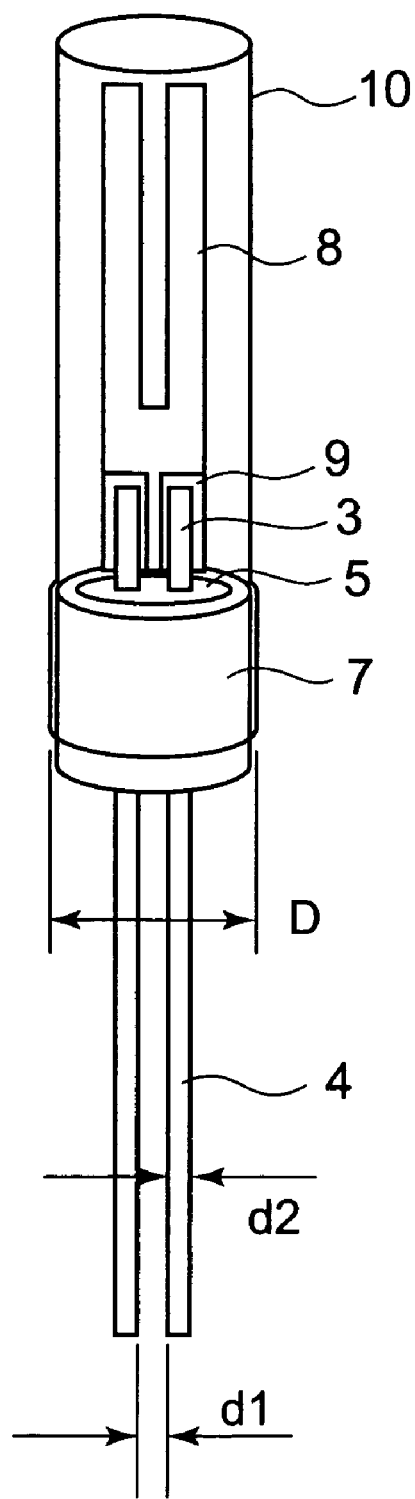
FIG. 19A is a perspective view showing the entire construction of a related-art cylinder type package piezoelectric vibrator.
Figure 19B:
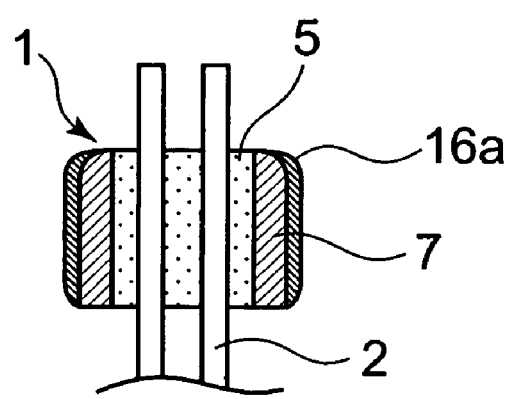
FIG. 19B is a plan view of an airtight terminal section of the related-art cylinder type package piezoelectric vibrator.
Figure 20A:
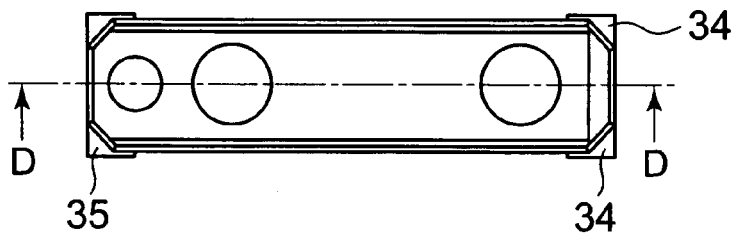
FIG. 20A is a plan view of a related-art cylinder type package piezoelectric vibrator.
Figure 20B:
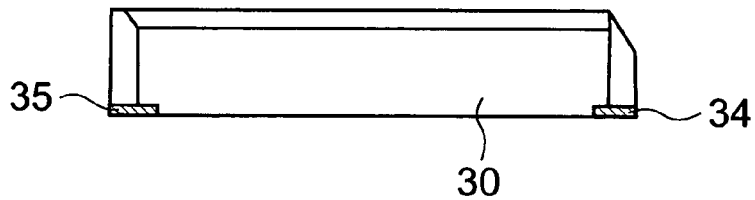
FIG. 20B is a front view of the related-art cylinder type package piezoelectric vibrator.
Figure 20E:
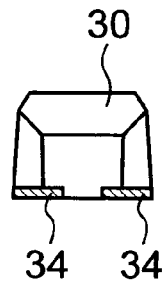
FIG. 20E is a right side view of the related-art cylinder type package piezoelectric vibrator of FIG. 20A.
Figure 20C:
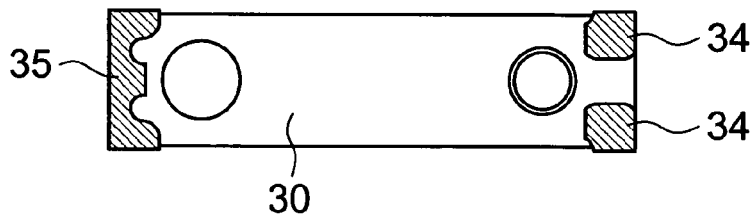
FIG. 20C is a bottom view of the related-art cylinder type package piezoelectric vibrator of FIG. 20A.
Figure 20D:
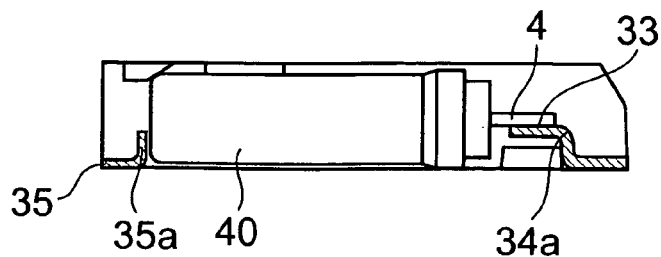
FIG. 20D is a cross sectional view of the related-art cylinder type package piezoelectric vibrator of FIG. 20A, taken along a line D-D.

FIG. 18 is a schematic diagram showing the circuit block of a wave timepiece as an electronic unit according to a fifth embodiment of the present invention. FIG. 18 shows an example of a tuning fork type quartz crystal vibrator (piezoelectric vibrator) produced by means of a method according to the present invention, which is connected to the filter section of the wave timepiece.

A wave timepiece is a timepiece provided with a function to receive and automatically correct a standard wave including time information to an accurate time and display the correct time. In Japan there are two transmitting stations (broadcasting stations) for transmitting a standard wave: one is in Fukushima Prefecture (40 KHz) and the other in Saga Prefecture (60 KHz). A long wave of 40 or 60 KHz has both a property of propagating along the earth surface and a property of propagating reflecting to the ionized layer and the earth surface. The long wave therefore has a wide propagation range and the long waves from the above two transmitting stations together cover the entire country.

In FIG. 18, an antenna 201 receives a long standard electric wave of 40 or 60 KHz. The long standard electric wave is a 40 or 60 KHz carrier wave subjected to AM modulation with time information called time code.

The long standard electric wave received is amplified by an amplifier 202 and filtered and synchronized by a filter section 205 including a quartz crystal vibrator 203, 204 having the same resonance frequency as the carrier frequency. A filtered signal having a predetermined frequency is detected and demodulated by a wave detection and rectification circuit 206. A time code is taken out by a waveform formation circuit 207 and counted by a CPU 208. The CPU 208 then reads information such as the current year, accumulated days, day of the week, and time. The information read is reflected to an RTC 209 and an accurate time information is displayed.

Since the carrier has a frequency of 40 KHz or 60 KHz, a vibrator having an above-mentioned configuration shaped like a tuning fork is preferable for the quartz crystal vibrators 203, 204 which constitutes the filter section. With 60 KHz taken as an example, it is possible to configure a tuning fork type quartz crystal vibrator having a full length of approximately 2.8 mm and a base with a width of approximately 0.5 mm.

A piezoelectric vibrator produced by means of a method according to the present invention is connected to the filter section of the wave timepiece, thereby making it possible to further reduce the size of the wave timepiece. The piezoelectric vibrator also has characteristics that are difficult to change because of the controlled fluctuation in resonance frequency and resonant resistance values therefor. After, therefore, the piezoelectric vibrator is mounted on a substrate, the electrical properties of the piezoelectric vibrator is sufficiently stable relative to a tension and compressive force due to cycles of changing ambient temperatures imposed on the piezoelectric vibrator. This allows the filter function of the wave timepiece to operate over a long period of time while keeping good accuracy.

What is claimed is:

1. A method of producing a piezoelectric vibrator having an airtight terminal comprised of an annular stem, a lead disposed to pass through the stem and formed of a conductive material, and a filler for fixing the lead in the stem, the piezoelectric vibrator having a vibrating piece connected to the lead of the airtight terminal and a case bonded to the airtight terminal to cover the vibrating piece, the method comprising:

an airtight terminal production process that produces the airtight terminal on a lead frame; and a piezoelectric vibrator assembly process that assembles the piezoelectric vibrator using the produced airtight terminal and on the same lead frame on which the airtight terminal is produced, the piezoelectric vibrator assembly process comprising the following steps:

a contour formation step of selecting a plate- or strip-shaped conductive material for use as the lead frame, disposing a contour formation portion for forming a contour of the lead for the airtight terminal and a base on the lead frame, forming a plurality of contours of the lead of the airtight terminal with one end thereof connected to the base by a connection at predetermined intervals, and forming a plurality of contours of an insulated connection with the one end thereof connected to the base on the contour formation portion with the insulated connection facing the lead so that each of the plurality of contours of the insulated connection is paired with each of the plurality of contours of the lead;

a filler shaping and sintering step of filling the lead having the contours thereof formed with the filler in a predetermined position and shaping the filler, filling the lead with the filler and shaping the filler to connect the one end of the lead to a non-base side of the insulated connection having the contours thereof formed, and sintering the two fillers shaped;

a stem mounting step of mounting the stem on a circumference of the fillers sintered, the fillers sintered being located on the lead;

a firing step of heating, melting and cooling the filler in the stem and the filler at the insulated connection;

a partial cutting step of cutting off a portion connected to the base of the lead; and a metal film formation step of forming a metal film on a surface of the lead and a surface of the stem.

2. A piezoelectric vibrator production method according to claim 1; wherein the contour formation step includes: arranging a plurality of contours of the lead on the contour formation portion at predetermined intervals; forming a contour of an external electrode terminal so that the contour branches off from each of the plurality of contours of the lead, is disposed to be parallel to the lead, and extends and is connected to the base; forming a contour of the insulated connection with one end thereof connected to the base so that the contour of the insulated connection faces each of the plurality of contours of the lead; and forming a dummy terminal connected to the base on the contour formation portion so that the dummy terminal faces the external electrode terminal.

3. A piezoelectric vibrator production method according to claim 1; wherein the piezoelectric vibrator assembly process comprises bending a portion of the lead connected the insulated connection of the lead frame at a predetermined angle before capping the case and correcting the bent portion of the lead so that the portion is at an original angle thereof.

4. A piezoelectric vibrator production method according to claim 1; wherein the contour formation step includes: arranging a plurality of contours of the lead on the contour formation portion at predetermined intervals; forming a contour of an external electrode terminal so that the contour branches off from each of the plurality of contours of the lead, is disposed to be parallel to the lead, and extends and is connected to the base; forming a contour of the insulated connection with one end thereof connected to the base so that the contour of the insulated connection faces each of the plurality of contours of the lead; and forming a dummy terminal connected to the base on the contour formation portion so that the dummy terminal faces the external electrode terminal.

5. A method of producing a piezoelectric vibrator having an airtight terminal comprised of an annular stem, a lead disposed to pass through the stem and formed of a conductive material, and a filler for fixing the lead in the stem, and the piezoelectric vibrator having a vibrating piece connected to the lead of the airtight terminal, a case bonded to the airtight terminal to cover the vibrating piece, and a mold resin for covering a surface of the case and a surface of the airtight terminal so that the other end of the lead is exposed, the method comprising:

an airtight terminal production process that produces the airtight terminal on a lead frame;

a piezoelectric vibrator assembly process that assembles the piezoelectric vibrator using the produced airtight terminal and on the same lead frame on which the airtight terminal is produced; and a resin shaping process that shapes the mold resin on the same lead frame on which the airtight terminal is produced and the piezoelectric vibrator is assembled.

6. A piezoelectric vibrator production method according to claim 5; wherein the airtight terminal production process comprises:

a contour formation step of selecting a plate- or strip-shaped conductive material for use as the lead frame, disposing a contour formation portion for forming a contour of the lead for the airtight terminal and a base on the lead frame, forming a plurality of contours of the lead of the airtight terminal with one end thereof connected to the base by a connection at predetermined intervals, and forming a plurality of contours of an insulated connection with the one end thereof connected to the base on the contour formation portion with the insulated connection facing the lead so that each of the plurality of contours of the insulated connection is paired with each of the plurality of contours of the lead;

a filler shaping and sintering step of filling the lead having the contours thereof formed with the filler in a predetermined position and shaping the filler, filling the lead with the filler and shaping the filler to connect the one end of the lead to a non-base side of the insulated connection having the contours thereof formed, and sintering the two fillers shaped;

a stem mounting step of mounting a stem on a circumference of the fillers sintered, the filler sintered being located on the lead;

a firing step of heating, melting and cooling the filler in the stem and the filler at the insulated connection;

a partial cutting step of cutting off a portion connected to the base of the lead; and a metal film formation step of forming a metal film on a surface of the lead and a surface of the stem.

7. A piezoelectric vibrator production method according to claim 6; wherein the piezoelectric vibrator assembly process comprises bending a portion of the lead connected the insulated connection of the lead frame at a predetermined angle before capping the case and correcting the bent portion of the lead so that the portion is at an original angle thereof.

8. A piezoelectric vibrator comprising:

an airtight terminal comprised of an annular stem, a lead passing through the stem and formed of a conductive material, an external electrode terminal branching off from the lead, and a filler that fixes the lead in the stem;

a vibrating piece connected to one end of the lead;

a case bonded to the airtight terminal to cover the vibrating piece; and a mold resin covering a surface of the case and a surface of the airtight terminal so that the other end of the lead is exposed.

9. A piezoelectric vibrator according to claim 8; wherein the external electrode terminal is shaped in the form of a crank.

10. A piezoelectric vibrator according to claim 9; wherein the external electrode terminal has a bent portion so that a horizontal surface at an end thereof is disposed at a bottom of the mold resin.

11. An oscillator comprising:

a piezoelectric vibrator comprised of an airtight terminal, a vibrating piece, an external electrode terminal, a case bonded to the airtight terminal to cover the vibrating piece, and a mold resin for covering a surface of the case and a surface of the airtight terminal, the airtight terminal having an annular stem, a lead formed of a conductive material and passing through the stem, and a filler that fixes the lead to the stem, the vibrating piece being connected to one end of the lead, the external electrode terminal being formed so as to branch off from the lead, and the mold resin covering the surface of the airtight terminal so that the other end of the lead is exposed; and an integrated circuit including an oscillation element connected to the piezoelectric vibrator.

12. An oscillator according to claim 11; wherein the external electrode terminal is shaped in the form of a crank.

13. An oscillator according to claim 12; wherein the external electrode terminal has a bent portion so that a horizontal surface at an end thereof is disposed at a bottom of the mold resin.

14. An electronic unit comprising:
a piezoelectric vibrator comprised of an airtight terminal, a vibrating piece, a case bonded to the airtight terminal to cover the vibrating piece, and a mold resin covering a surface of the case and a surface of the airtight terminal, the airtight terminal having an annular stem, a lead formed of a conductive material and passing through the stem, and a filler that fixes the lead to the stem, the vibrating piece being connected to one end of the lead, the external electrode terminal being formed so as to branch off from the lead, and the mold resin covering the surface of the airtight terminal so that the other end of the lead is exposed; and
a timekeeping section connected to the piezoelectric vibrator.

15. An electronic unit according to claim 14; wherein the external electrode terminal is shaped in the form of a crank.

16. An electronic unit according to claim 15; wherein the external electrode terminal has a bent portion so that a horizontal surface at an end thereof is disposed at a bottom of the mold resin.

17. A wave timepiece comprising:
a piezoelectric vibrator comprised of an airtight terminal, a vibrating piece, a case bonded to the airtight terminal to cover the vibrating piece, and a mold resin covering a surface of the case and a surface of the airtight terminal, the airtight terminal having an annular stem, a lead formed of a conductive material and passing through the stem, and a filler that fixes the lead to the stem, the vibrating piece being connected to one end of the lead, the external electrode terminal being formed so as to branch off from the lead, and the mold resin covering the surface of the airtight terminal so that the other end of the lead is exposed; and
a filter section connected to the piezoelectric vibrator.

18. A wave timepiece according to claim 17; wherein the external electrode terminal is shaped in the form of a crank.

19. A wave timepiece according to claim 18; wherein the external electrode terminal has a bent portion so that a horizontal surface at an end thereof is disposed at the bottom of the mold resin.

* * * * *